(12) United States Patent
Liu et al.

(10) Patent No.: US 12,085,854 B2
(45) Date of Patent: Sep. 10, 2024

(54) PHOTORESIST COMPOSITIONS AND PATTERN FORMATION METHODS

(71) Applicant: ROHM AND HAAS ELECTRONIC MATERIALS LLC, Marlborough, MA (US)

(72) Inventors: Cong Liu, Shrewsbury, MA (US); Jong Keun Park, Shrewsbury, MA (US); James F. Cameron, Brookline, MA (US); Sheng Liu, Bow, NH (US); Tsutomu Asazuma, Agano (JP); Mingqi Li, Shrewsbury, MA (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 161 days.

(21) Appl. No.: 17/490,738

(22) Filed: Sep. 30, 2021

(65) Prior Publication Data
US 2023/0104130 A1    Apr. 6, 2023

(51) Int. Cl.
*G03F 7/038* (2006.01)
*G03F 7/004* (2006.01)
*G03F 7/039* (2006.01)

(52) U.S. Cl.
CPC ............ *G03F 7/0045* (2013.01); *G03F 7/038* (2013.01); *G03F 7/039* (2013.01)

(58) Field of Classification Search
None
See application file for complete search history.

(56) References Cited

U.S. PATENT DOCUMENTS

| | | | |
|---|---|---|---|
| 4,189,323 A | 2/1980 | Buhr | |
| 6,599,677 B2 | 7/2003 | Szmanda et al. | |
| 6,627,391 B1 * | 9/2003 | Ito | G03F 7/0395 430/326 |
| 8,431,325 B2 | 4/2013 | Hashimoto et al. | |
| 9,052,590 B2 | 6/2015 | Takahashi et al. | |
| 9,846,360 B2 | 12/2017 | Hatakeyama et al. | |
| 2015/0079520 A1 * | 3/2015 | Namai | G03F 7/40 546/214 |
| 2015/0125794 A1 * | 5/2015 | Hatakeyama | G03F 7/2041 430/296 |
| 2016/0377979 A1 * | 12/2016 | Miyagawa | G03F 7/38 430/270.1 |
| 2017/0131632 A1 | 5/2017 | Namai et al. | |
| 2020/0209743 A1 * | 7/2020 | Marangoni | G03F 7/0392 |

FOREIGN PATENT DOCUMENTS

JP    2015094898 A    5/2015

OTHER PUBLICATIONS

Metabocard for Norambreinolide, (2022), Human Metabolome Database, https://hmdb.ca/metabolites/HMDB0035293 (Year: 2022).*
Ito et al. "Chemical Amplification Resists for Microlithography", Adv Polym Sci (2005) 172: 37-245.

* cited by examiner

*Primary Examiner* — Mark F. Huff
*Assistant Examiner* — Nicholas E Brown
(74) *Attorney, Agent, or Firm* — CANTOR COLBURN LLP

(57) ABSTRACT

A photoresist composition comprising a polymer, a photoacid generator, an additive comprising a tertiary carbon atom as a ring-forming atom of a lactone ring, and a solvent.

18 Claims, No Drawings

PHOTORESIST COMPOSITIONS AND PATTERN FORMATION METHODS

FIELD

The present invention relates to photoresist compositions and to pattern formation methods using such photoresist compositions. The invention finds particular applicability in lithographic applications in the semiconductor manufacturing industry.

BACKGROUND

Photoresist materials are photosensitive compositions typically used for transferring an image to one or more underlying layers such as a metal, semiconductor, or dielectric layer disposed on a semiconductor substrate. To increase the integration density of semiconductor devices and allow for the formation of structures having dimensions in the nanometer range, photoresists and photolithography processing tools having high-resolution capabilities have been and continue to be developed.

Further miniaturization of the critical dimensions often cannot be realized by current lithographic techniques with low production cost. For example, NAND flash manufacturers have been looking into techniques for stacking multiple layers of memory cells to achieve greater storage capacity while still maintaining lower manufacturing cost per bit. Miniaturization of critical features while keeping the manufacturing cost low, has led to the development of stacked 3D structures for NAND applications. Such 3D NAND devices are denser, faster, and less expensive than the traditional 2D planar NAND devices. The 3D NAND architecture comprises vertical channel and vertical gate architectures, and the stepped structure (known as "staircase") is used to form an electrical connection between memory cells and bit lines or word lines. In constructing 3D NAND flash memories, manufacturers increase the number of stairs using a thick resist that allows for multiple trimming and etching cycles used for staircase formation Maintaining good feature profile on each step is challenging since subsequent trimming-etching variations on critical dimension (CD) will be accumulated step by step and across the wafer.

The process of "staircase" formation using a single mask exposure of a thick KrF photoresist to form several sets of stairs is considered a relatively cost-effective approach. However, the use of thick films in KrF lithography for printing micrometer scale features is associated with unique technical challenges. Patterning a thick resist film requires sufficient film transparency at exposure wavelength to allow incident radiation to reach the bottom of the film. Moreover, thick resist film used in 3D NAND applications are subject to multiple resist thickness trim and dry etch cycles. Exposing thick resist film to trim and etch treatments can affect film structure uniformity and can lead to the formation of rough film surfaces and the formation of undesired voids in the film. Suitable thick resist films should be able to maintain film physical structure after each film thickness trim and etch treatment.

Therefore, there is a continuing need for chemical compositions that could be suitable for thick photoresists, which have good transparency at exposure wavelength, excellent retention of properties after thickness trimming and etching, and improved adhesion at the substrate-photoresist interface.

SUMMARY

Provided is a photoresist composition including a polymer, a photoacid generator, an additive comprising a tertiary carbon atom as a ring-forming atom of a lactone ring, and a solvent.

Also provided is a method for forming a pattern, the method comprising applying a layer of the inventive photoresist composition on a substrate to provide a photoresist composition layer, pattern-wise exposing the photoresist composition layer to activating radiation to provide an exposed photoresist composition layer, and developing the exposed photoresist composition layer to provide the pattern.

DETAILED DESCRIPTION

Reference will now be made in detail to exemplary embodiments, examples of which are illustrated in the present description. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As used herein, the terms "a," "an," and "the" do not denote a limitation of quantity and are to be construed to cover both the singular and the plural, unless otherwise indicated herein or clearly contradicted by context. "Or" means "and/or" unless clearly indicated otherwise. The modifier "about" used in connection with a quantity is inclusive of the stated value and has the meaning dictated by the context (e.g., includes the degree of error associated with measurement of the particular quantity). All ranges disclosed herein are inclusive of the endpoints, and the endpoints are independently combinable with each other. The suffix "(s)" is intended to include both the singular and the plural of the term that it modifies, thereby including at least one of that term. "Optional" or "optionally" means that the subsequently described event or circumstance can or cannot occur, and that the description includes instances where the event occurs and instances where it does not. The terms "first," "second," and the like, herein do not denote an order, quantity, or importance, but rather are used to distinguish one element from another. When an element is referred to as being "on" another element, it may be directly in contact with the other element or intervening elements may be present therebetween. In contrast, when an element is referred to as being "directly on" another element, there are no intervening elements present. It is to be understood that the described components, elements, limitations, and/or features of aspects may be combined in any suitable manner in the various aspects.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "actinic rays" or "radiation" means, for example, a bright line spectrum of a mercury lamp, far ultraviolet rays represented by an excimer laser, extreme ultraviolet rays (EUV light), X-rays, particle rays such as electron beams and ion beams, or the like. In addition, in the present invention, "light" means actinic rays or radiation.

The krypton fluoride laser (KrF laser) is a particular type of excimer laser, which is sometimes referred to as an exciplex laser. "Excimer" is short for "excited dimer," while "exciplex" is short for "excited complex." An excimer laser uses a mixture of a noble gas (argon, krypton, or xenon) and a halogen gas (fluorine or chlorine), which under suitable conditions of electrical stimulation and high pressure, emits coherent stimulated radiation (laser light) in the ultraviolet range.

Furthermore, "exposure" in the present specification includes, unless otherwise specified, not only exposure by a mercury lamp, far ultraviolet rays represented by an excimer laser, X-rays, extreme ultraviolet rays (EUV light), or the like, but also writing by particle rays such as electron beams and ion beams.

As used herein, the term "hydrocarbon" refers to an organic compound or group having at least one carbon atom and at least one hydrogen atom; "alkyl" refers to a straight or branched chain saturated hydrocarbon group having the specified number of carbon atoms and having a valence of one; "alkylene" refers to an alkyl group having a valence of two; "hydroxyalkyl" refers to an alkyl group substituted with at least one hydroxyl group (—OH); "alkoxy" refers to "alkyl-O—"; "carboxyl" and "carboxylic acid group" refer to a group having the formula "—C(O)—OH"; "cycloalkyl" refers to a monovalent group having one or more saturated rings in which all ring members are carbon; "cycloalkylene" refers to a cycloalkyl group having a valence of two; "alkenyl" refers to a straight or branched chain, monovalent hydrocarbon group having at least one carbon-carbon double bond; "alkenoxy" refers to "alkenyl-O—"; "alkenylene" refers to an alkenyl group having a valence of two; "cycloalkenyl" refers to a non-aromatic cyclic divalent hydrocarbon group having at least three carbon atoms, with at least one carbon-carbon double bond; "alkynyl" refers to a monovalent hydrocarbon group having at least one carbon-carbon triple bond; the term "aromatic group" refers to a monocyclic or polycyclic ring system that satisfies the Huckel Rule and includes carbon atoms in the ring, and optionally may include one or more heteroatoms selected from N, O, and S instead of a carbon atom in the ring; "aryl" refers to a monovalent aromatic monocyclic or polycyclic ring system where every ring member is carbon, and may include a group with an aromatic ring fused to at least one cycloalkyl or heterocycloalkyl ring; "arylene" refers to an aryl group having a valence of two; "alkylaryl" refers to an aryl group that has been substituted with an alkyl group; "arylalkyl" refers to an alkyl group that has been substituted with an aryl group; "aryloxy" refers to "aryl-O—"; and "arylthio" refers to "aryl-S—".

The prefix "hetero" means that the compound or group includes at least one member that is a heteroatom (e.g., 1, 2, 3, or 4 or more heteroatom(s)) instead of a carbon atom, wherein the heteroatom(s) is each independently N, O, S, Si, or P; "heteroatom-containing group" refers to a substituent group that includes at least one heteroatom; "heteroalkyl" refers to an alkyl group having at least one heteroatom instead of carbon; "heterocycloalkyl" refers to a cycloalkyl group having at least one heteroatom as ring member instead of carbon; "heterocycloalkylene" refers to a heterocycloalkyl group having a valence of two.

The term "heteroaryl" means an aromatic 4-8 membered monocyclic, 8-12 membered bicyclic, or 11-14 membered tricyclic ring systems having 1-4 heteroatoms (if monocyclic), 1-6 heteroatoms (if bicyclic), or 1-9 heteroatoms (if tricyclic) that are each independently selected from N, O, S, Si, or P (e.g., carbon atoms and 1-3, 1-6, or 1-9 heteroatoms of N, O, or S, if monocyclic, bicyclic, or tricyclic, respectively). Examples of heteroaryl groups include pyridyl, furyl (furyl or furanyl), imidazolyl, benzimidazolyl, pyrimidinyl, thiophenyl or thienyl, quinolinyl, indolyl, thiazolyl, and the like.

The term "halogen" means a monovalent substituent that is fluorine (fluoro), chlorine (chloro), bromine (bromo), or iodine (iodo). The prefix "halo" means a group including one or more of a fluoro, chloro, bromo, or iodo substituent instead of a hydrogen atom. A combination of halo groups (e.g., bromo and fluoro), or only fluoro groups may be present. For example, the term "haloalkyl" refers to an alkyl group substituted with one or more halogens. As used herein, "substituted $C_{1-8}$ haloalkyl" refers to a $C_{1-8}$ alkyl group substituted with at least one halogen, and is further substituted with one or more other substituent groups that are not halogens. It is to be understood that substitution of a group with a halogen atom is not to be considered a heteroatom-containing group, because a halogen atom does not replace a carbon atom.

"Fluorinated" shall be understood to mean having one or more fluorine atoms incorporated into the group. For example, where a $C_{1-18}$ fluoroalkyl group is indicated, the fluoroalkyl group can include one or more fluorine atoms, for example, a single fluorine atom, two fluorine atoms (e.g., as a 1,1-difluoroethyl group), three fluorine atoms (e.g., as a 2,2,2-trifluoroethyl group), or fluorine atoms at each free valence of carbon (e.g., as a perfluorinated group such as —$CF_3$, —$C_2F_5$, —$C_3F_7$, or —$C_4F_9$). A "substituted fluoroalkyl group" shall be understood to mean a fluoroalkyl group that is further substituted by an additional substituent group that does not contain fluorine atoms.

Where appropriate, each of the foregoing substituent groups optionally may be substituted unless expressly provided otherwise. The term "optionally substituted" refers to being substituted or unsubstituted. "Substituted" means that at least one hydrogen atom of the chemical structure is replaced with another terminal substituent group that is typically monovalent, provided that the designated atom's normal valence is not exceeded. When the substituent is oxo (i.e., O), then two geminal hydrogen atoms on the carbon atom are replaced with the terminal oxo group. Combinations of substituents or variables are permissible. Exemplary substituent groups that may be present on a "substituted" position include, but are not limited to, nitro (—$NO_2$), cyano (—CN), hydroxyl (—OH), oxo (O), amino (—$NH_2$), mono- or di-($C_{1-6}$)alkylamino, alkanoyl (such as a $C_{2-6}$ alkanoyl group such as acyl), formyl (—C(O)H), carboxylic acid or an alkali metal or ammonium salt thereof; esters (including acrylates, methacrylates, and lactones) such as $C_{2-6}$ alkyl esters (—C(O)O-alkyl or —OC(O)-alkyl) and $C_{7-13}$ aryl esters (—C(O)O-aryl or —OC(O)-aryl); amido (—C(O) $NR_2$ wherein R is hydrogen or $C_{1-6}$ alkyl), carboxamido (—$CH_2C(O)NR_2$ wherein R is hydrogen or $C_{1-6}$ alkyl), halogen, thiol (—SH), $C_{1-6}$ alkylthio (—S-alkyl), thiocyano (—SCN), $C_{1-6}$ alkyl, $C_{2-6}$ alkenyl, $C_{2-6}$ alkynyl, $C_{1-6}$ haloalkyl, $C_{1-9}$ alkoxy, $C_{1-6}$ haloalkoxy, $C_{3-12}$ cycloalkyl, $C_{5-18}$ cycloalkenyl, $C_{2-18}$ heterocycloalkenyl, $C_{6-12}$ aryl having at least one aromatic ring (e.g., phenyl, biphenyl, naphthyl, or the like, each ring either substituted or unsubstituted aromatic), $C_{7-19}$ arylalkyl having 1 to 3 separate or fused rings and from 6 to 18 ring carbon atoms, arylalkoxy having 1 to 3 separate or fused rings and from 6 to 18 ring carbon atoms, $C_{7-12}$ alkylaryl, $C_{3-12}$ heterocycloalkyl, $C_{3-12}$ heteroaryl, $C_{1-6}$ alkyl sulfonyl (—S(O)$_2$-alkyl), $C_{6-12}$ arylsulfonyl (—S(O)$_2$-aryl), or tosyl (CH$_3$C$_6$H$_4$SO$_2$—). When a group is substituted, the indicated number of carbon atoms is the total number of carbon atoms in the group, excluding those of any substituents. For example, the group —CH$_2$CH$_2$CN is a cyano-substituted C$_2$ alkyl group.

As used herein, an "acid-labile group" refers to a group in which a bond is cleaved by the catalytic action of an acid, optionally and typically with thermal treatment, resulting in formation of a polar group, such as a carboxylic acid or alcohol group, being formed on the polymer, and optionally and typically with a moiety connected to the cleaved bond becoming disconnected from the polymer. In other systems, a non-polymeric compound may include an acid-labile group that may be cleaved by the catalytic action of an acid, resulting in formation of a polar group, such as a carboxylic acid or alcohol group on a cleaved portion of the non-polymeric compound. Such acid is typically a photo-generated acid with bond cleavage occurring during post-exposure baking (PEB); however, embodiments are not limited thereto, and, for example, such acid may be thermally generated. Suitable acid-labile groups include, for example: tertiary alkyl ester groups, secondary or tertiary aryl ester groups, secondary or tertiary ester groups having a combination of alkyl and aryl groups, tertiary alkoxy groups, acetal groups, or ketal groups. Acid-labile groups are also commonly referred to in the art as "acid-cleavable groups," "acid-cleavable protecting groups," "acid-labile protecting groups," "acid-leaving groups," "acid-decomposable groups," and "acid-sensitive groups."

As used herein, when a definition is not otherwise provided, a "divalent linking group" refers to a divalent group including one or more of —O—, —S—, —Te—, —Se—, —C(O)—, —N(R$^a$)—, —S(O)—, —S(O)$_2$—, —C(S)—, —C(Te)—, —C(Se)—, substituted or unsubstituted $C_{1-30}$ alkylene, substituted or unsubstituted $C_{3-30}$ cycloalkylene, substituted or unsubstituted $C_{3-30}$ heterocycloalkylene, substituted or unsubstituted $C_{6-30}$ arylene, substituted or unsubstituted $C_{3-30}$ heteroarylene, or a combination thereof, wherein R$^a$ is hydrogen, substituted or unsubstituted $C_{1-20}$ alkyl, substituted or unsubstituted $C_{1-20}$ heteroalkyl, substituted or unsubstituted $C_{6-30}$ aryl, or substituted or unsubstituted $C_{3-30}$ heteroaryl. Typically, the divalent linking group includes one or more of —O—, —S—, —C(O)—, —N(R$^a$)—, —S(O)—, —S(O)$_2$—, substituted or unsubstituted $C_{1-30}$ alkylene, substituted or unsubstituted $C_{3-30}$ cycloalkylene, substituted or unsubstituted $C_{3-30}$ heterocycloalkylene, substituted or unsubstituted $C_{6-30}$ arylene, substituted or unsubstituted $C_{3-30}$ heteroarylene, or a combination thereof, wherein R$^a$ is hydrogen, substituted or unsubstituted $C_{1-20}$ alkyl, substituted or unsubstituted $C_{1-20}$ heteroalkyl, substituted or unsubstituted $C_{6-30}$ aryl, or substituted or unsubstituted $C_{3-30}$ heteroaryl. More typically, the divalent linking group includes at least one of —O—, —C(O)—, —C(O)O—, —N(R$^a$)—, —C(O)N(R$^a$)—, substituted or unsubstituted $C_{1-10}$ alkylene, substituted or unsubstituted $C_{3-10}$ cycloalkylene, substituted or unsubstituted $C_{3-10}$ heterocycloalkylene, substituted or unsubstituted $C_{6-10}$ arylene, substituted or unsubstituted $C_{3-10}$ heteroarylene, or a combination thereof, wherein R$^a$ is hydrogen, substituted or unsubstituted $C_{1-10}$ alkyl, substituted or unsubstituted $C_{1-10}$ heteroalkyl, substituted or unsubstituted $C_{6-10}$ aryl, or substituted or unsubstituted $C_{3-10}$ heteroaryl.

Thick films derived from photoresist compositions ("thick film photoresists") can be used as etch masks for generating surface features, such as staircase architecture patterns for 3D NAND electronic device manufacturing. The patterning methods used to prepare 3D NAND electronic devices typically require thick photoresist films that have a thickness of 5 micrometers or greater for use with 248 nm irradiation. As the photoresist film thickness increases, the photoresist suffers from insufficient photospeed, likely from decreasing transmittance of light at 248 nm. In addition, the greater film thickness results in poorer adhesion of the photoresist film to the substrate at the photoresist-substrate interface, which may be caused by increased film stress.

The present invention relates to photoresist compositions that include a polymer; a photoacid generator (PAG), an additive comprising a tertiary carbon atom as a ring-forming atom of a lactone ring, a solvent, and may contain additional, optional components. The inventors have discovered that particular photoresist compositions of the invention can be used to prepare photoresist films that have improved lithographic properties, for example, enhanced photospeed, improved adhesion at the photoresist-substrate interface, and reduced delamination from the substrate surface.

The lactone ring that includes a tertiary carbon atom as a ring-forming atom of the lactone ring may undergo a ring-opening reaction to form alkenyl carboxylic acids in the presence of a strong acid catalyst, for example from a thermal or photogenerated acid. The resulting alkenyl carboxylic acids have increased solubility in basic developers compared to the additive that has not undergone the ring opening reaction. The increased solubility can increase the dissolution rate of thick films that are derived from the inventive photoresist compositions in basic developers, which results in faster photospeeds.

Without wishing to be bound to theory, the additive may function as a plasticizer in the inventive photoresist compositions. Because thick films obtained from the inventive photoresist composition include a plasticizer, the subsequently generated acids (e.g., a photoacid) may diffuse faster within the film, which increases photospeed. In addition, when the additive plasticizes the film derived from the inventive photoresist composition, the resulting thick film has a lower stress, which reduces the amount of film delamination.

The additive of the inventive photoresist compositions may be a compound represented by Formula (1):

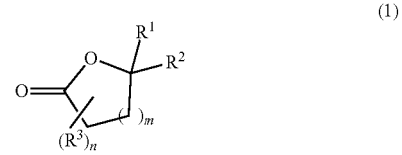

wherein m may be an integer from 1 to 5, typically from 1 to 3, preferably 1 or 2.

In Formula (1), R$^1$ and R$^2$ are each independently substituted or unsubstituted $C_{1-20}$ alkyl, substituted or unsubstituted $C_{1-20}$ heteroalkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl. The substituted or unsubstituted $C_{1-20}$ alkyl and the substituted or unsubstituted $C_{1-20}$ heteroalkyl groups each may be straight chain or branched. The substituted or unsubstituted $C_{3-20}$ cycloalkyl, the substituted or unsubstituted $C_{3-20}$ heterocycloalkyl, the substituted or unsubstituted $C_{6-20}$ aryl, and the substituted or unsubstituted $C_{3-20}$ heteroaryl groups each may be monocyclic or polycyclic. In some aspects, $R^1$ and $R^2$ are each independently substituted or unsubstituted $C_{1-6}$ alkyl, preferably substituted or unsubstituted $C_{1-3}$ alkyl, and more preferably unsubstituted $C_{1-3}$ alkyl, typically methyl. Each of $R^1$ and $R^2$ optionally may further comprise as part of their structure one or more groups selected from —O—, —C(O)—, —S—, —S(O)$_2$—, and —N($R^{1a}$)—, wherein $R^{1a}$ is hydrogen, substituted or unsubstituted $C_{1-20}$ alkyl, substituted or unsubstituted $C_{3-20}$ cycloalkyl, or substituted or unsubstituted $C_{3-20}$ heterocycloalkyl.

In Formula (1), each $R^3$ independently may be substituted or unsubstituted $C_{1-20}$ alkyl, substituted or unsubstituted $C_{1-20}$ heteroalkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl. The substituted or unsubstituted $C_{1-20}$ alkyl and the substituted or unsubstituted $C_{1-20}$ heteroalkyl may be straight chain or branched. The substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl may be monocyclic or polycyclic. Each $R^3$ optionally may further comprise as part of its structure one or more groups selected from —O—, —C(O)—, —S—, —S(O)$_2$—, and —N($R^{2a}$)—, wherein $R^{2a}$ is hydrogen, substituted or unsubstituted $C_{1-20}$ alkyl, substituted or unsubstituted $C_{3-20}$ cycloalkyl, or substituted or unsubstituted $C_{3-20}$ heterocycloalkyl. In some aspects, each $R^3$ independently may be substituted or unsubstituted $C_{1-6}$ alkyl, preferably substituted or unsubstituted $C_{1-3}$ alkyl, and more preferably unsubstituted $C_{1-3}$ alkyl, typically methyl.

In Formula (1), any two of $R^1$, $R^2$, or $R^3$ together optionally may form a ring via a single bond or a divalent linking group. In some aspects, when n is 2 or greater, any two groups $R^3$ together optionally may form a ring via a divalent linking group.

In Formula (1), n is an integer from 0 to 2(m+1). For example, n may be an integer from 0 to 12, typically from 0 to 6, preferably from 0 to 4. It is to be understood that a hydrogen atom is present when a group $R^3$ is not present at a given position of the lactone ring in Formula (1).

In some aspects, the additive may be a compound represented by one or more of Formulae (1a) or (1b):

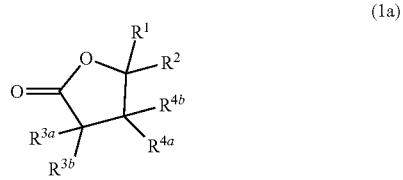

(1a)

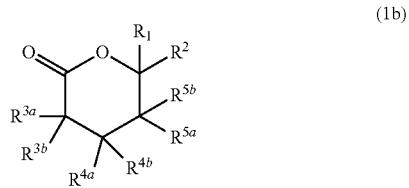

(1b)

In Formulae (1a) and (1b), $R^1$ and $R^2$ are the same as defined in Formula (1).

In Formula (1a), $R^{3a}$, $R^{3b}$, $R^{4a}$, and $R^{4b}$ may each independently be hydrogen, substituted or unsubstituted $C_{1-20}$ alkyl, substituted or unsubstituted $C_{1-20}$ heteroalkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl. In some aspects, at least one of $R^{3a}$, $R^{3b}$, $R^{4a}$, and $R^{4b}$ is not hydrogen. In an embodiment, one or more of $R^{4a}$ and $R^{4b}$ is substituted or unsubstituted $C_{1-20}$ alkyl, and the substituted $C_{1-20}$ alkyl is substituted with one or more of —O—, —C(O)—, —N($R^{1c}$)—, —S—, —S(O)$_2$—, substituted or unsubstituted $C_{3-30}$ cycloalkylene, substituted or unsubstituted $C_{3-30}$ heterocycloalkylene, substituted or unsubstituted $C_{6-30}$ arylene, substituted or unsubstituted divalent $C_{7-30}$ arylalkyl, substituted or unsubstituted $C_{3-30}$ heteroarylene, or substituted or unsubstituted divalent $C_{4-30}$ heteroarylalkyl, wherein $R^{1c}$ is hydrogen, substituted or unsubstituted $C_{1-20}$ alkyl, substituted or unsubstituted $C_{3-20}$ cycloalkyl, or substituted or unsubstituted $C_{3-20}$ heterocycloalkyl.

In Formula (1a), any two or more of $R^{3a}$, $R^{3b}$, $R^{4a}$, and/or $R^{4b}$ together optionally may form a ring group via a single bond or a divalent linking group, wherein the ring group is a monocyclic, non-fused polycyclic, or fused polycyclic.

In Formula (1b), $R^{3a}$, $R^{3b}$, $R^{4a}$, $R^{4b}$, $R^{5a}$, and $R^{5b}$ may each independently be hydrogen, substituted or unsubstituted $C_{1-20}$ alkyl, substituted or unsubstituted $C_{1-20}$ heteroalkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl. In some aspects, at least one of $R^{3a}$, $R^{3b}$, $R^{4a}$, $R^{4b}$, $R^{5a}$, and $R^{5b}$ is not hydrogen. In other aspects, at least one of $R^{3a}$, $R^{3b}$, $R^{5a}$, and $R^{5b}$ is not hydrogen. In an embodiment, one or more of $R^{5a}$ and $R^{5b}$ is substituted or unsubstituted $C_{1-20}$ alkyl, and the substituted $C_{1-20}$ alkyl is substituted with one or more of —O—, —C(O)—, —N($R^{1d}$)—, —S—, —S(O)$_2$—, substituted or unsubstituted $C_{3-30}$ cycloalkylene, substituted or unsubstituted $C_{3-30}$ heterocycloalkylene, substituted or unsubstituted $C_{6-30}$ arylene, substituted or unsubstituted divalent $C_{7-30}$ arylalkyl, substituted or unsubstituted $C_{3-30}$ heteroarylene, or substituted or unsubstituted divalent $C_{3-30}$ heteroarylalkyl, wherein $R^{1d}$ is hydrogen, substituted or unsubstituted $C_{1-20}$ alkyl, substituted or unsubstituted $C_{3-20}$ cycloalkyl, or substituted or unsubstituted $C_{3-20}$ heterocycloalkyl.

In Formula (1b), any two or more of $R^{3a}$, $R^{3b}$, $R^{4a}$, $R^{4b}$, $R^{5a}$, and/or $R^{5b}$ together optionally may form a ring group via a single bond or a divalent linking group, wherein the ring group is a monocyclic, non-fused polycyclic, or fused polycyclic.

Exemplary additives include those of the following Formulae:

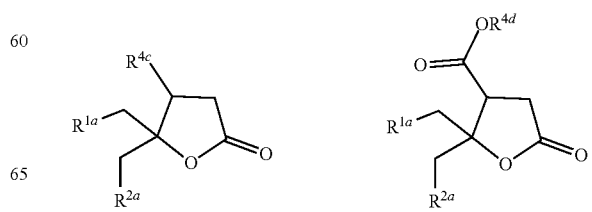

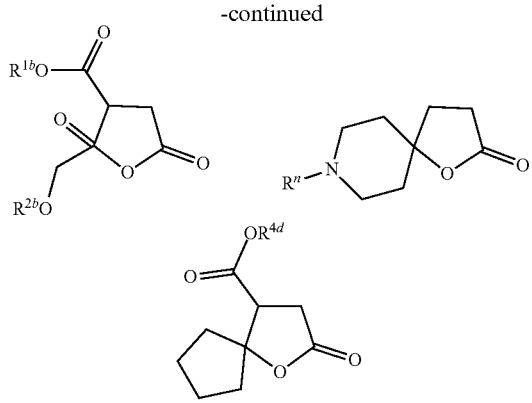

wherein $R^{4a}$ is as defined in Formula (1a), and $R^{1a}$, $R^{1b}$, $R^{2a}$, $R^{2b}$, $R^{4c}$, $R^{4d}$, and $R^n$ are each independently hydrogen, substituted or unsubstituted $C_{1-20}$ alkyl, substituted or unsubstituted $C_{1-20}$ heteroalkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl. Any two or more of $R^{3aa}$, $R^{3bb}$, and/or $R^{4a}$ together optionally may form a ring group via a single bond or a divalent linking group, wherein the ring group is a monocyclic, non-fused polycyclic, or fused polycyclic. Any two or more of $R^{3aa}$, $R^{3bb}$, and/or $R^{4aa}$ together optionally may form a ring group via a single bond or a divalent linking group, wherein the ring group is a monocyclic, non-fused polycyclic, or fused polycyclic.

Particularly useful additives may include, but are not limited to, one or more of the following compounds:

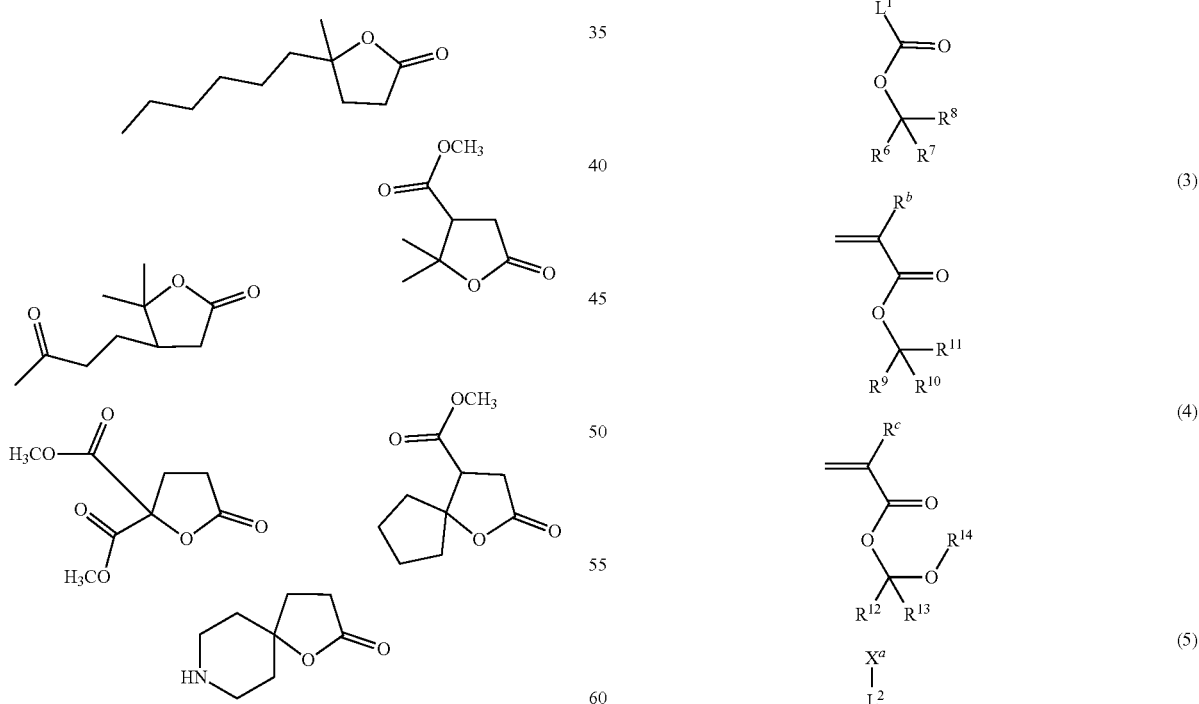

In some aspects, the additive may have a boiling point of greater than or equal to 200° C., for example when measure at ambient pressure or atmospheric pressure. As used herein, "ambient pressure" is about 1 atmosphere. For example, the additive may have a boiling point from 200° C. to 260° C. at ambient pressure.

The additive is typically present in the photoresist composition in an amount from 1 to 40 wt %, typically from 5 to 35 wt %, and more typically from 10 to 30 wt %, based on total solids of the photoresist composition. It will be understood that "total solids" includes the polymer, PAG, additive, and other non-solvent components.

The additives of the present invention may be prepared using any method in the art or may be commercially available. For example, the additives may be prepared by chemically modifying a commercially available lactone compound to include one or more functional groups. For example, commercially available lactones include, but are not limited to, tetrahydro-2,2,-dimethyl-5-oxo-3-furancarboxylic acid (terebic acid), 2-carboxytetrahydro-5-oxo-2-furanacetic acid, 2-oxo-1-oxaspiro[4,4]nonane-4-carboxylic acid, 5-hexyldihydro-5-methyl-2(3H)-furanone, 4-hydroxy-4-methyl-3-(3-oxobutyl)-valeric acid gamma lactone, camphanic acid, or 1-oxa-8-azaspiro(4.5)decan-2-one.

The photoresist composition includes a polymer. In some aspects, the polymer may include a repeating unit comprising an acid-labile group, which can be cleaved by photogenerated acid at post-exposure bake conditions. The polymer of the photoresist composition may include an acid-labile repeating unit derived from a monomer represented by one or more of Formulae (2), (3), (4), (5), or (6):

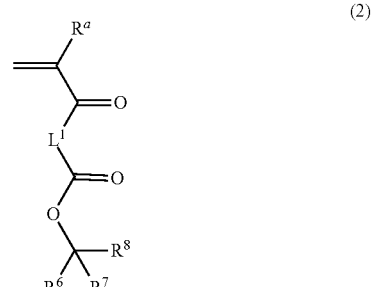

(2)

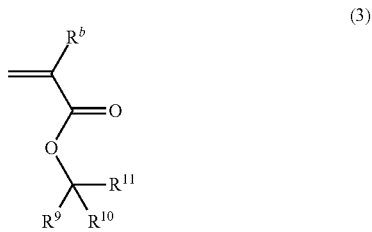

(3)

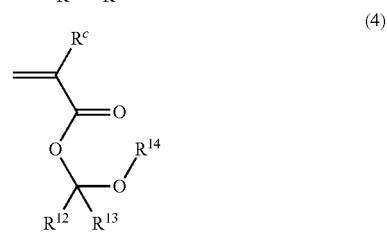

(4)

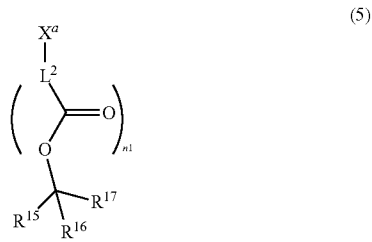

(5)

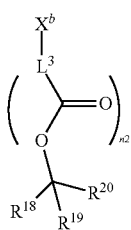

(6)

In Formulae (2), (3), and (4), $R^a$, $R^b$, and $R^c$ may each independently be hydrogen, fluorine, cyano, or substituted or unsubstituted $C_{1-10}$ alkyl. Preferably, $R^a$, $R^b$, and $R^c$ may each independently be hydrogen, fluorine, or substituted or unsubstituted $C_{1-5}$ alkyl, typically methyl.

In Formula (2), $L^1$ is a divalent linking group. For example, $L^1$ may include 1 to 10 carbon atoms and at least one heteroatom. In a typical example, $L^1$ may be —$OCH_2$—, —$OCH_2CH_2O$—, or —$N(R^{2a})$—, wherein $R^{2a}$ is hydrogen or $C_{1-6}$ alkyl.

In Formulae (2) and (3), $R^6$ to $R^{11}$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{3-20}$ heteroaryl, provided that no more than one of $R^6$ to $R^8$ may be hydrogen and no more than one of $R^9$ to $R^{11}$ may be hydrogen, and provided that if one of $R^6$ to $R^8$ is hydrogen, then at least one of the others from $R^6$ to $R^8$ is substituted or unsubstituted $C_{6-20}$ aryl or substituted or unsubstituted $C_{3-20}$ heteroaryl, and if one of $R^9$ to $R^{11}$ is hydrogen, then at least one of the others from $R^9$ to $R^{11}$ is substituted or unsubstituted $C_{6-20}$ aryl or substituted or unsubstituted $C_{3-20}$ heteroaryl. Preferably, $R^6$ to $R^{11}$ are each independently substituted or unsubstituted $C_{1-6}$ alkyl or substituted or unsubstituted $C_{3-10}$ cycloalkyl. Each of $R^6$ to $R^{11}$ may optionally further comprise a divalent linking group as part of their structure.

For example, any one or more of $R^6$ to $R^{11}$ may be independently a group of the formula —$CH_2C(O)CH_{(3-n)}Y_n$, or —$CH_2C(O)OCH_{(3-n)}Y_n$, where each Y is independently substituted or unsubstituted $C_{3-10}$ heterocycloalkyl and n is 1 or 2. For example, each Y may be independently substituted or unsubstituted $C_{3-10}$ heterocycloalkyl including a group of the formula —$O(C^{a1})(C^{a2})O$—, wherein $C^{a1}$ and $C^{a2}$ are each independently hydrogen or substituted or unsubstituted alkyl, and where $C^{a1}$ and $C^{a2}$ together optionally form a ring.

In Formula (2), any two of $R^6$ to $R^8$ together optionally may form a ring, which may further include a divalent linking group as part of its structure, and wherein the ring may be substituted or unsubstituted.

In Formula (3), any two of $R^9$ to $R^{11}$ together optionally may form a ring, which may further include a divalent linking group as part of its structure, wherein the ring group may be substituted or unsubstituted.

In Formulae (4) and (6), $R^{12}$, $R^{13}$, $R^{18}$, and $R^{19}$ each independently may be hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl; and $R^{14}$ and $R^{20}$ are each independently substituted or unsubstituted $C_{1-20}$ alkyl, substituted or unsubstituted $C_{3-20}$ cycloalkyl, or substituted or unsubstituted $C_{3-20}$ heterocycloalkyl. Preferably, $R^{12}$, $R^{13}$, $R^{15}$, and $R^{16}$ each independently may be hydrogen, substituted or unsubstituted $C_{1-20}$ alkyl, substituted or unsubstituted $C_{3-20}$ cycloalkyl, or substituted or unsubstituted $C_{3-20}$ heterocycloalkyl. Each of $R^{12}$, $R^{13}$, $R^{18}$ and $R^{19}$ may optionally further comprise a divalent linking group as part of their structure.

In Formula (4), any two of $R^{12}$ to $R^{14}$ together optionally may form a ring, which may further include a divalent linking group as part of its structure, wherein the ring group may be substituted or unsubstituted.

In Formula (5), $R^{15}$ to $R^{17}$ may be each independently be substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl, provided that no more than one of $R^{15}$ to $R^{17}$ may be hydrogen and provided that if one of $R^{15}$ to $R^{17}$ is hydrogen, then at least one of the others from $R^{15}$ to $R^{17}$ is substituted or unsubstituted $C_{6-20}$ aryl or substituted or unsubstituted $C_{3-20}$ heteroaryl. Each of $R^{15}$ to $R^{17}$ may optionally further comprise a divalent linking group as part of their structure.

For example, any one or more of $R^{15}$ to $R^{17}$ may be independently a group of the formula —$CH_2C(O)CH_{(3-n)}Y_n$, or —$CH_2C(O)OCH_{(3-n)}Y_n$, where each Y is independently substituted or unsubstituted $C_{3-10}$ heterocycloalkyl and n is 1 or 2. For example, each Y may be independently substituted or unsubstituted $C_{3-10}$ heterocycloalkyl including a group of the formula —$O(C^{a1})(C^{a2})O$—, wherein $C^{a1}$ and $C^{a2}$ are each independently hydrogen or substituted or unsubstituted alkyl, and where $C^{a1}$ and $C^{a2}$ together optionally form a ring.

In Formula (5), any two of $R^{15}$ to $R^{17}$ together optionally form a ring, which may further include a divalent linking group as part of its structure, wherein the ring group may be substituted or unsubstituted.

In Formulae (5) and (6), $X^a$ and $X^b$ are each independently a polymerizable group selected from vinyl and norbornyl.

In Formulae (5) and (6), $L^2$ and $L^3$ are each independently a single bond or a divalent linking group, provided that $L^2$ is not a single bond when $X^a$ is vinyl and that $L^3$ is not a single bond when $X^b$ is vinyl. Preferably, $L^2$ and $L^3$ are each independently substituted or unsubstituted $C_{6-30}$ arylene or substituted or unsubstituted $C_{6-30}$ cycloalkylene. In Formulae (5) and (6), n1 is 0 or 1 and n2 is 0 or 1. It is to be understood that when n1 is 0, the $L^2$ group is connected directly to the oxygen atom. It is to be understood that when n2 is 0, the $L^3$ group is connected directly to the oxygen atom.

In Formula (6), any two of $R^{18}$ to $R^{20}$ together optionally may form a ring, which may further include a divalent linking group as part of its structure, wherein the ring group may be substituted or unsubstituted.

In some aspects, each of $R^6$ to $R^{20}$ optionally may include as part of their structure one or more divalent linking groups selected from —O—, —C(O)—, —C(O)—O—, —S—, —$S(O)_2$—, and $N(R')$—$S(O)_2$—, wherein R' may be hydrogen, substituted or unsubstituted $C_{1-20}$ alkyl, substituted or unsubstituted $C_{3-20}$ cycloalkyl, or substituted or unsubstituted $C_{3-20}$ heterocycloalkyl.

In some aspects, in the repeating unit comprising an acid-labile group, the acid-labile group may be a tertiary alkyl ester. For example, a repeating unit comprising a tertiary alkyl ester group may be derived from one or more monomers of Formulae (2), (3), or (5), wherein none of $R^6$ to $R^{11}$ is hydrogen, and n1 is 1.

Exemplary monomers of Formula (2) include one or more of the following:
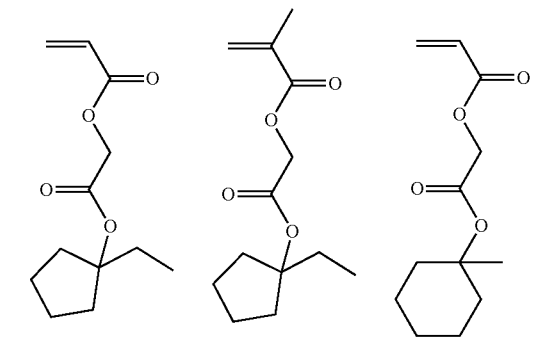
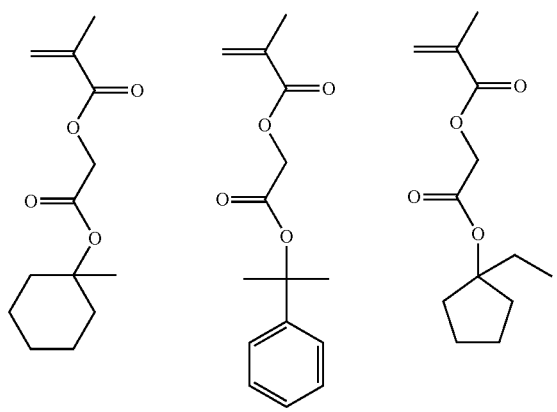
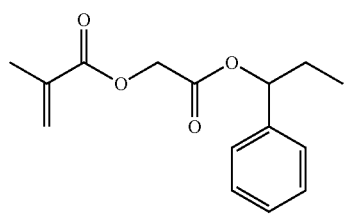
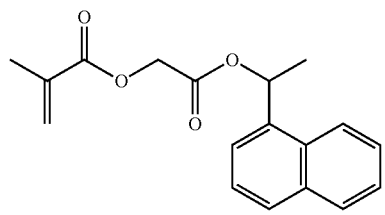
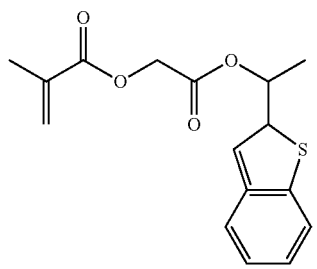
Exemplary monomers of Formula (3) include one or more of the following:
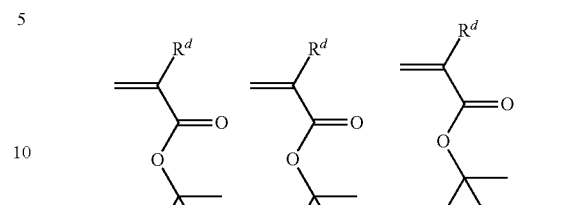
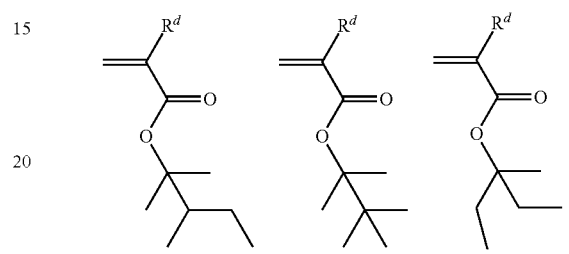
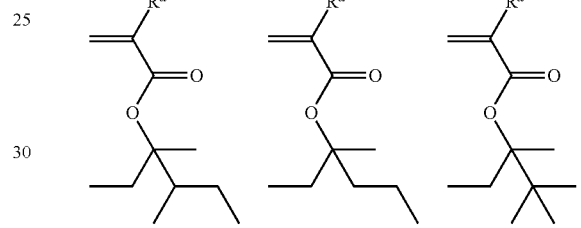
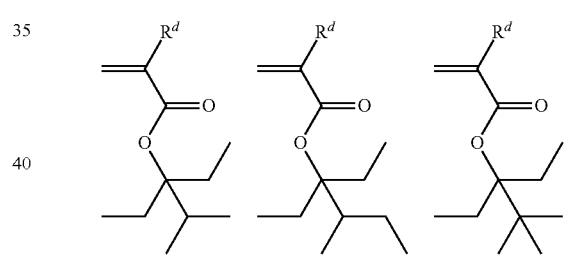
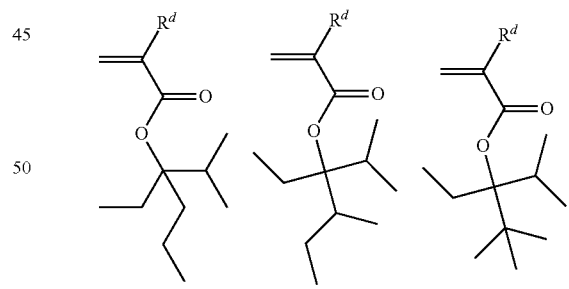
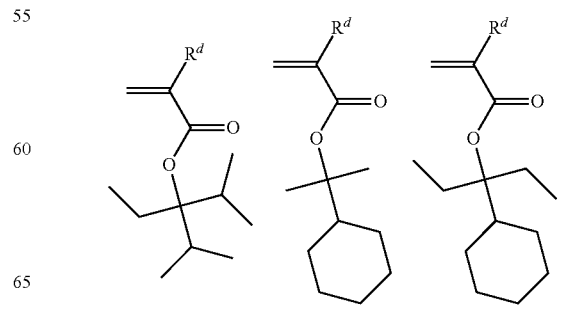

-continued

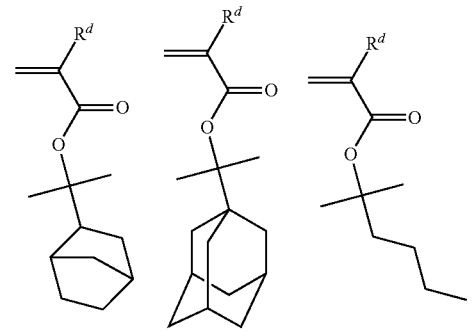
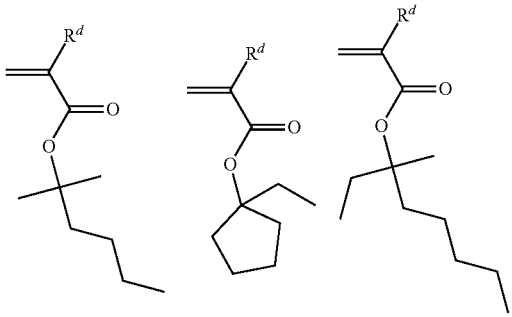
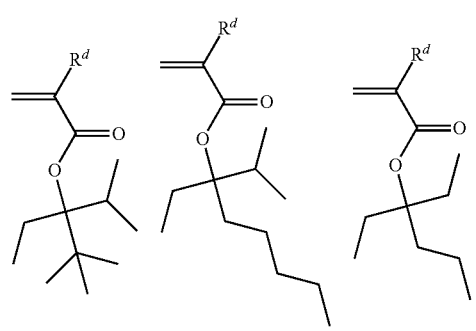
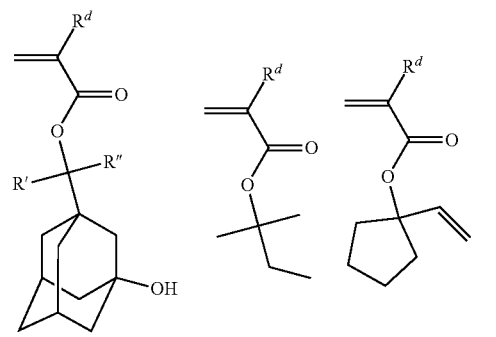
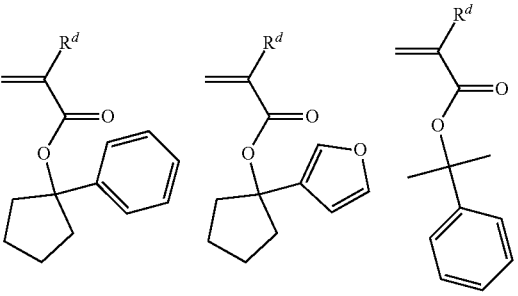

-continued

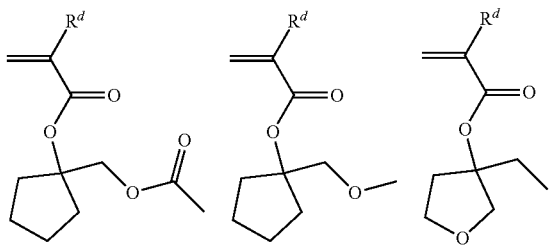
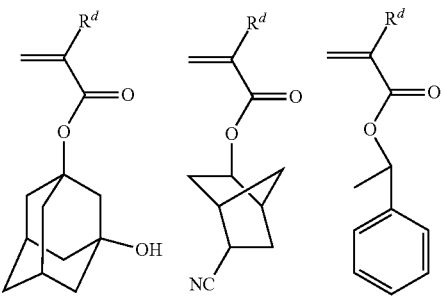
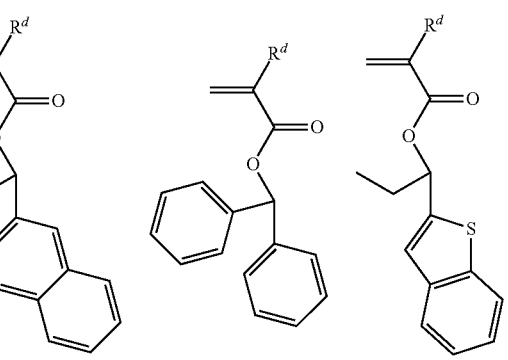
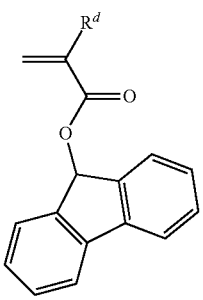

wherein $R^d$ is as defined herein for $R^b$ in Formula (3); and R' and R" are each independently substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{3-20}$ heteroaryl.

Exemplary monomers of Formula (4) include one or more of the following:
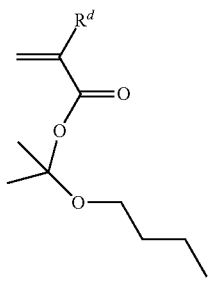 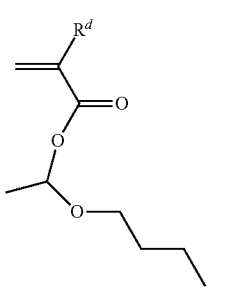
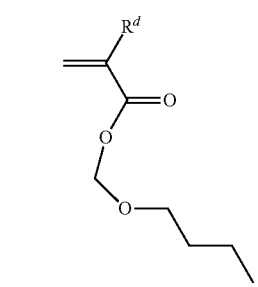 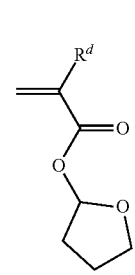
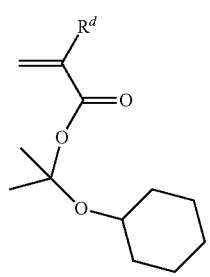 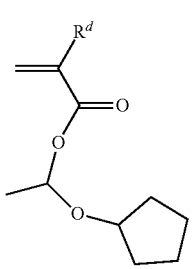
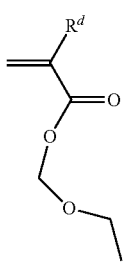 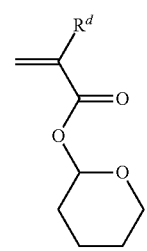
wherein $R^d$ is as defined above for $R^c$.
Exemplary monomers of Formula (5) include one or more of the following:
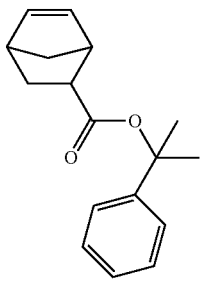 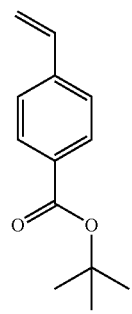
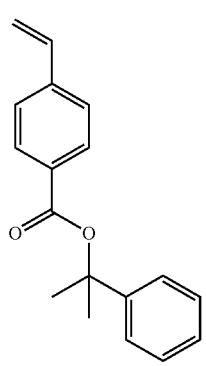 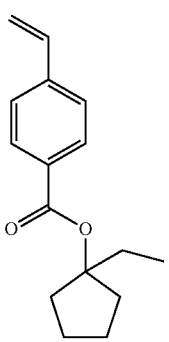
Exemplary monomers of Formula (6) include one or more of the following:
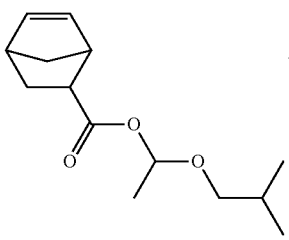 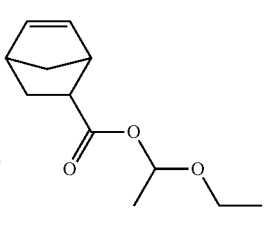
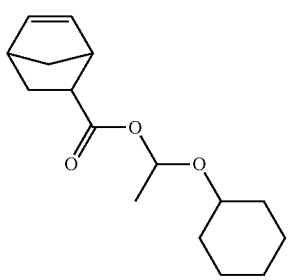 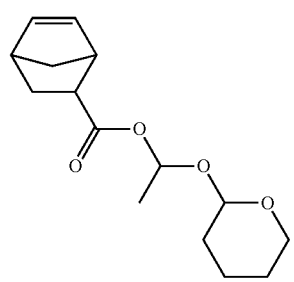

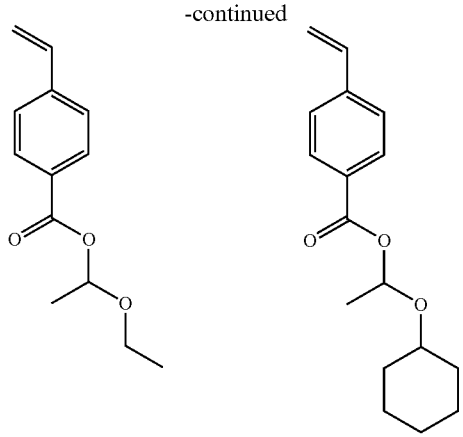
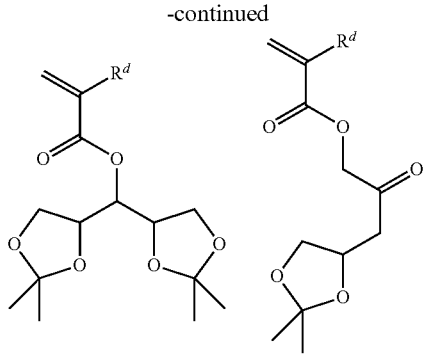
In still another example, the polymer may have an acid-labile repeating unit that is derived from one or more monomers having a cyclic acetal or cyclic ketal group, for example, having one or more of the following structures:
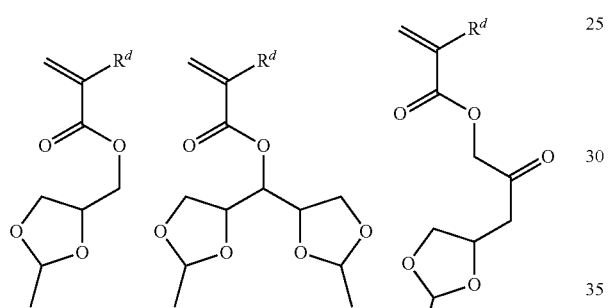
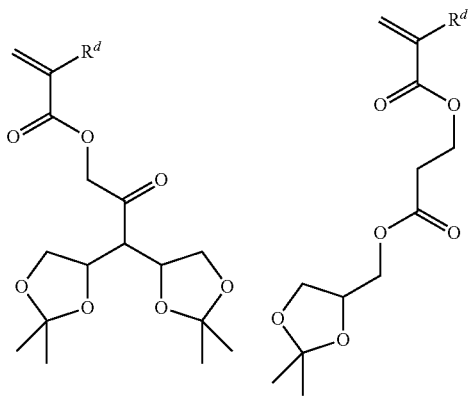
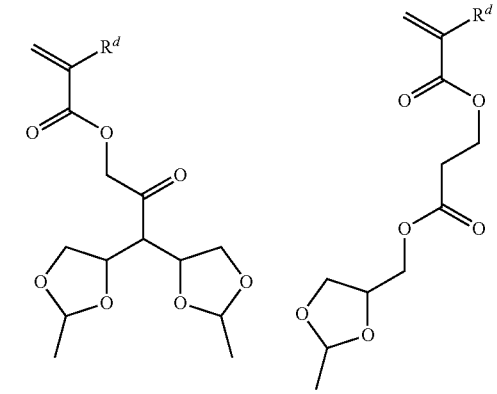
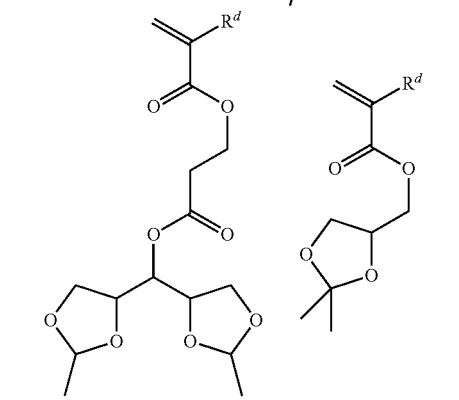
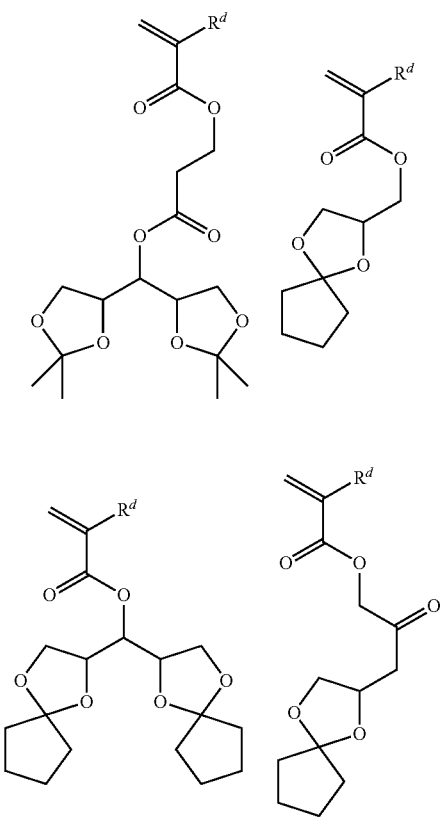

-continued

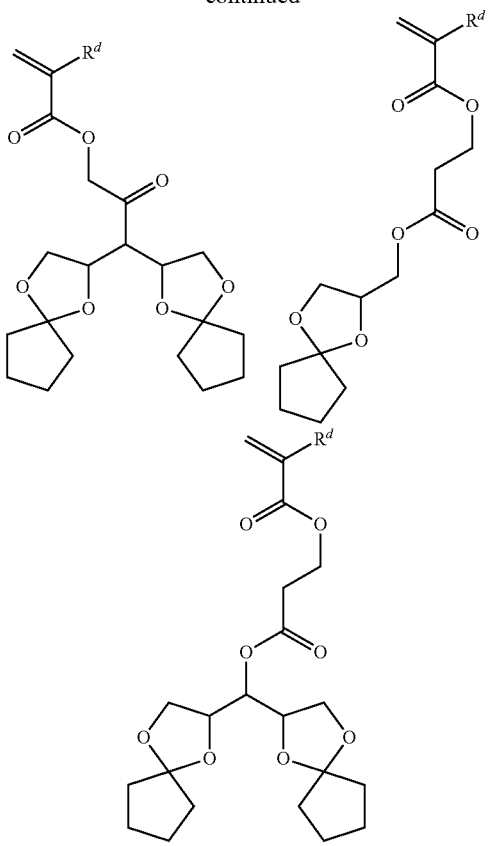

wherein $R^d$ is as defined above for $R^a$.

In some aspects, the polymer may have a repeating unit having an acid-labile group that comprises a tertiary alkoxy group, for example, one or more monomers of the following:

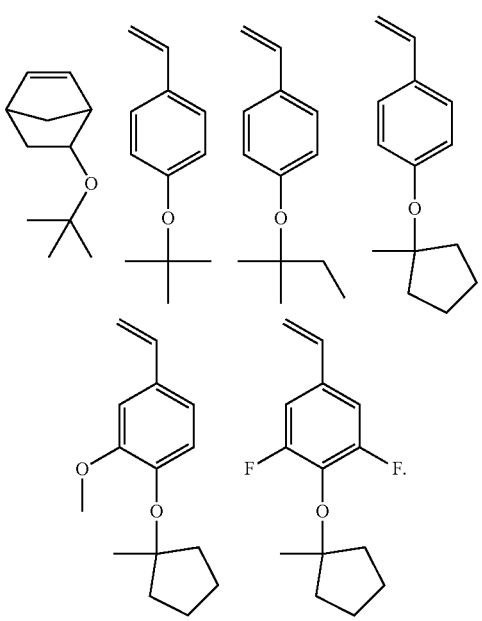

The repeating unit having an acid-labile group is typically present in the polymer in an amount from 5 to 80 mol %, more typically from 15 to 75 mol %, still more typically from 20 to 60 mol %, based on total repeating units in the polymer.

The polymer may further optionally include one or more additional repeating units. The additional repeating units may be, for example, one or more additional units for purposes of adjusting properties of the photoresist composition, such as etch rate and solubility. Exemplary additional units may include those derived from one or more of (meth)acrylate, vinyl aromatic, vinyl ether, vinyl ketone, and/or vinyl ester monomers. The one or more additional repeating units, if present in the polymer, may be used in an amount of up to 90 mol %, typically from 3 to 50 mol %, based on total repeating units of the polymer.

The polymer may further include a repeating unit derived from one or more monomers of Formulae (7) or (8):

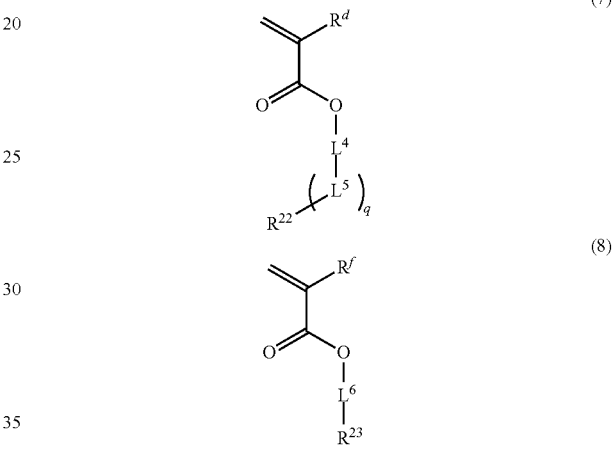

wherein $R^d$ and $R^f$ are each independently hydrogen, fluorine, cyano, or substituted or unsubstituted $C_{1-10}$ alkyl.

In Formula (7), $L^4$ is a single bond or a divalent linking group. Exemplary divalent linking groups for $L^4$ include one or more of substituted or unsubstituted $C_{1-20}$ alkylene, substituted or unsubstituted $C_{3-20}$ cycloalkylene, or substituted or unsubstituted $C_{3-20}$ heterocycloalkylene.

In Formula (7), $L^5$ is a divalent linking group. Exemplary divalent linking groups for $L^5$ include one or more of substituted or unsubstituted $C_{1-20}$ alkylene, substituted or unsubstituted $C_{3-20}$ cycloalkylene, substituted or unsubstituted $C_{3-20}$ heterocycloalkylene, —O—, —C(O)—, —S—, —S(O)$_2$—, and N($R^{22a}$)—S(O)$_2$, wherein $R^{22a}$ may be hydrogen, substituted or unsubstituted $C_{1-20}$ alkyl, substituted or unsubstituted $C_{3-20}$ cycloalkyl, or substituted or unsubstituted $C_{3-20}$ heterocycloalkyl.

In Formula (7), q is 0 or 1.

It is to be understood that when $L^4$ is a single bond, the moiety $R^{22}$-$L^5$- is directly connected to the oxygen atom adjacent to the carbonyl group (i.e., —C(O)—O-$L^5$-$R^{22}$). Similarly, it is to be understood that when q is 0, the moiety $R^{22}$— is directly connected to group $L^4$ (i.e., —C(O)—O-$L^4$-$R^{22}$). For the case where $L^4$ is a single bond and q is 0, it is to be understood that the moiety $R^{22}$ is directly connected to the oxygen atom adjacent to the carbonyl group (i.e., —C(O)—O—$R^{22}$)

In Formula (7), $R^{22}$ is a substituted or unsubstituted organic group comprising one or more heteroatoms. Exemplary organic groups comprising one or more heteroatoms of the present invention include, but are not limited to, nitro (—NO₂), cyano (—CN), amino (—NR$^{22b}$R$^{22c}$, wherein R$^{22b}$ and R$^{22c}$ are each independently hydrogen, substituted or unsubstituted C$_{1-10}$ alkyl, substituted or unsubstituted C$_{6-12}$ aryl, or substituted or unsubstituted C$_{3-12}$ heteroaryl), hydroxyl (—OH), carboxyl (—C(O)—OH), substituted or unsubstituted C$_{1-20}$ alkoxy, substituted or unsubstituted C$_{6-24}$ aryloxy, thiol (—SH), substituted or unsubstituted C$_{6-24}$ arylthiol, sulfonyl, or a combination thereof.

In some aspects, the repeating unit derived from a monomer of Formula (7) comprises a hydroxy-substituted C$_{1-30}$ alkyl group, a hydroxy-substituted C$_{3-30}$ cycloalkyl group, a hydroxy-substituted C$_{6-30}$ aryl group, a hydroxy-substituted C$_{3-30}$ heteroaryl group, or a combination thereof, each of which is optionally further substituted.

In Formula (8), L$^6$ is a single bond or a divalent linking group. Exemplary divalent linking groups for L$^6$ include one or more of substituted or unsubstituted C$_{1-30}$ alkylene, substituted or unsubstituted C$_{1-30}$ heteroalkylene, substituted or unsubstituted C$_{3-30}$ cycloalkylene, substituted or unsubstituted C$_{3-30}$ heterocycloalkylene, substituted or unsubstituted C$_{6-30}$ arylene, substituted or unsubstituted C$_{3-30}$ heteroarylene, —O—, —C(O)—, —S—, —S(O)$_2$—, or —N(R$^{23a}$)—S(O)$_2$—, wherein R$^{23a}$ may be hydrogen, substituted or unsubstituted C$_{1-20}$ alkyl, substituted or unsubstituted C$_{3-20}$ cycloalkyl, or substituted or unsubstituted C$_{3-20}$ heterocycloalkyl.

It is to be understood that when L$^6$ is a single bond, the moiety R$^{23}$— is directly connected to the oxygen atom adjacent to the carbonyl group (i.e., —C(O)O—R$^{23}$).

In Formula (8), R$^{23}$ is a substituted or unsubstituted C$_{4-20}$ lactone-containing group or a substituted or unsubstituted C$_{4-20}$ sultone-containing group. The C$_{4-20}$ lactone-containing group and the C$_{4-20}$ sultone-containing group may be monocyclic, polycyclic, or fused polycyclic.

Exemplary monomers of Formula (7) may include one or more of the following:

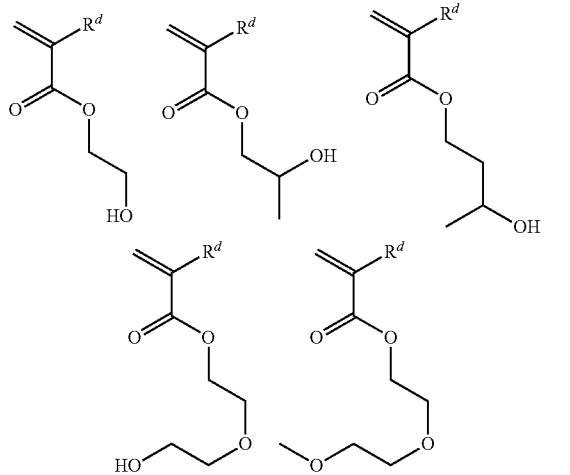

wherein R$^d$ is as defined for Formula (7).

Exemplary monomers of Formula (8) may include one or more of the following:

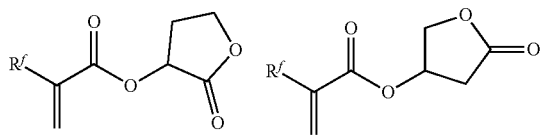

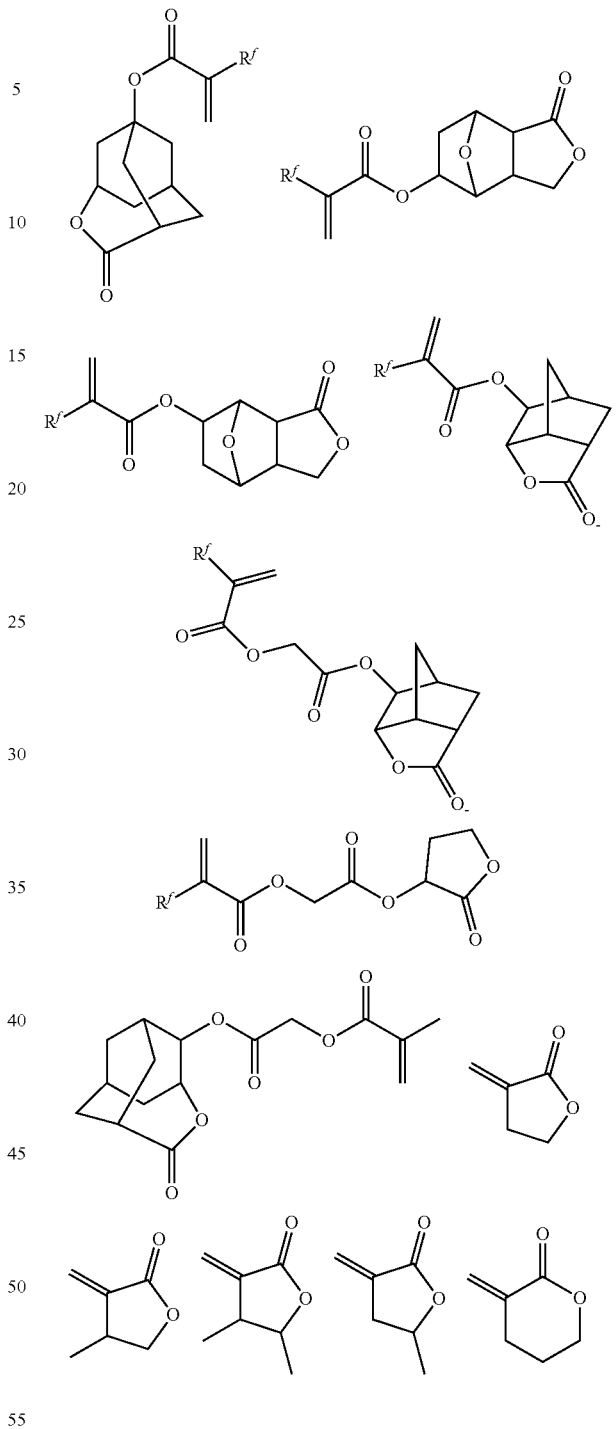

wherein R$^f$ is as defined for Formula (8).

When present, the polymer typically comprises a repeating unit derived from a monomer of Formulae (7) and/or (8) in a combined amount from 5 to 60 mol %, typically 20 to 55 mol %, more typically 25 to 50 mol % based on total repeating units in the polymer.

In some aspects, the polymer may further include a base-soluble repeating unit having a pKa of less than or equal to 12. For example, the base-soluble repeating unit can be derived from one or more monomers of Formulae (9), (10), or (11):

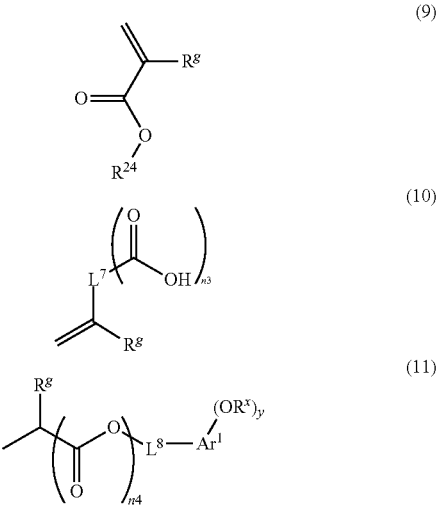

In Formulae (9) to (11), each $R^g$ may be hydrogen, fluorine, cyano, or substituted or unsubstituted $C_{1-10}$ alkyl. Preferably, $R^g$ may be hydrogen, fluorine, or substituted or unsubstituted $C_{1-5}$ alkyl, typically methyl.

In Formula (9), $R^{24}$ may be substituted or unsubstituted $C_{1-100}$ or $C_{1-20}$ alkyl, typically $C_{1-12}$ alkyl; substituted or unsubstituted $C_{3-30}$ or $C_{3-20}$ cycloalkyl; or substituted or unsubstituted poly($C_{1-3}$ alkylene oxide). Preferably, the substituted $C_{1-100}$ or $C_{1-20}$ alkyl, the substituted $C_{3-30}$ or $C_{3-20}$ cycloalkyl, and the substituted poly($C_{1-3}$ alkylene oxide) are substituted with one or more of halogen, a fluoroalkyl group such as a $C_{1-4}$ fluoroalkyl group, typically fluoromethyl, a sulfonamide group —NH—S(O)$_2$—Y$^1$ where Y$^1$ is F or $C_{1-4}$ perfluoroalkyl (e.g., —NHSO$_2$CF$_3$), or a fluoroalcohol group (e.g., —C(CF$_3$)$_2$OH).

In Formula (10), $L^7$ represents a single bond or a multivalent linking group chosen, for example, from optionally substituted aliphatic, such as $C_{1-6}$ alkylene or $C_{3-20}$ cycloalkylene, and aromatic hydrocarbons, and combinations thereof, optionally with one or more linking moieties chosen from —O—, —S—, —C(O)—, and —NR$^{102}$— wherein $R^{102}$ is chosen from hydrogen and optionally substituted $C_{1-10}$ alkyl. For example, the polymer may further include a repeating unit derived from one or more monomers of Formula (10) wherein $L^7$ is a single bond or a multivalent linking group selected from substituted or unsubstituted $C_{1-20}$ alkylene, typically $C_{1-6}$ alkylene; substituted or unsubstituted $C_{3-20}$ cycloalkylene; typically, $C_{3-10}$ cycloalkylene; and substituted or unsubstituted $C_{6-24}$ arylene.

In Formula (10), n3 is an integer from 1 to 5, typically 1. It is to be understood that when n3 is 1, the group $L^7$ is a divalent linking group. It is to be understood that when n3 is 2, the group $L^7$ is a trivalent linking group. Similarly, it is to be understood that when n3 is 3, the group $L^7$ is a tetravalent linking group; when n3 is 4, the group $L^7$ is a pentavalent linking group; and when n3 is 5, the group $L^7$ is a hexavalent linking group. Accordingly, in the context of Formula (10), the term "multivalent linking group" refers to any of a divalent, trivalent, tetravalent, pentavalent, and/or hexavalent linking groups. In some aspects, when n is 2 or greater, the carboxylic acid groups (—C(O)—OH) may be connected to the same atom of the linking group $L^7$. In other aspects, when n is 2 or greater, the carboxylic acid groups (—C(O)—OH) may be connected to different atoms of the linking group $L^7$.

In Formula (11), $L^8$ represents a single bond or a divalent linking group. Preferably, $L^8$ may be a single bond, substituted or unsubstituted $C_{6-30}$ arylene, or substituted or unsubstituted $C_{6-30}$ cycloalkylene.

In Formula (11), n4 is 0 or 1. It is to be understood that when n4 is 0, the moiety represented by —OC(O)— is a single bond such that $L^8$ is directly connected to the alkenyl (vinylic) carbon atom.

In Formula (11), $Ar^1$ is a substituted $C_{5-60}$ aromatic group that optionally includes one or more aromatic ring heteroatoms chosen from N, O, S, or a combination thereof, wherein the aromatic group may be monocyclic, non-fused polycyclic, or fused polycyclic. When the $C_{5-60}$ aromatic group is polycyclic, the ring or ring groups may be fused (such as naphthyl or the like), non-fused, or a combination thereof. When the polycyclic $C_{5-60}$ aromatic group is non-fused, the ring or ring groups may be directly linked (such as biaryls, biphenyl, or the like) or may be bridged by a heteroatom (such as triphenylamino or diphenylene ether). In some aspects, the polycyclic $C_{5-60}$ aromatic group may include a combination of fused rings and directly linked rings (such as binaphthyl or the like).

In Formula (11), y may be an integer from 1 to 12, preferably from 1 to 6, and typically from 1 to 3. Each $R^x$ may independently be hydrogen or methyl.

Non-limiting examples of monomers that may be used to provide a base-soluble repeating unit in the polymer include one or more of the following:

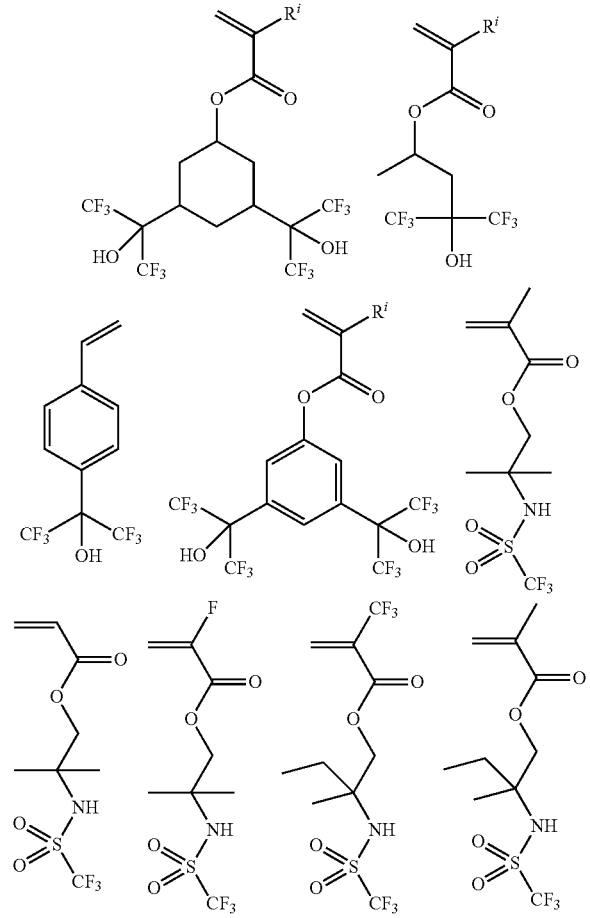

-continued
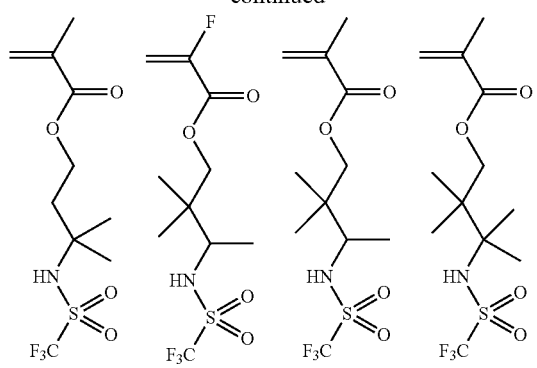
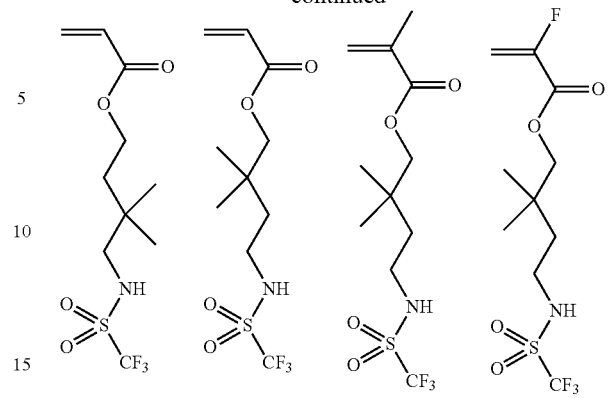
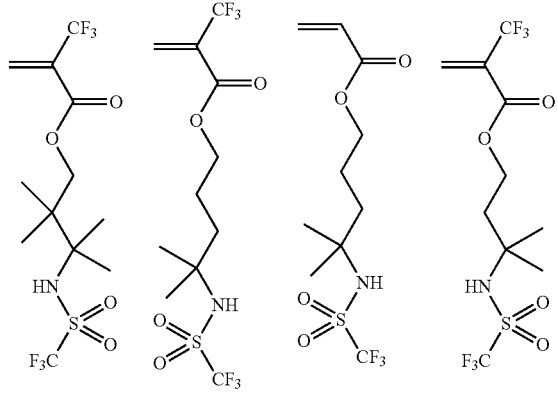
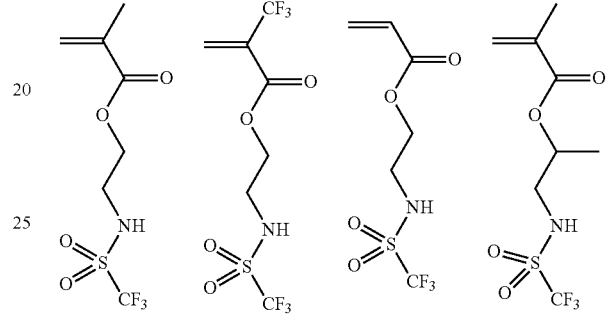
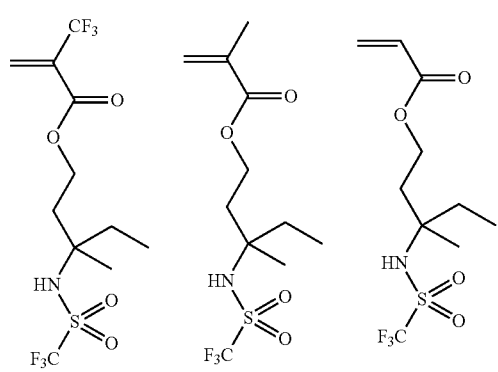
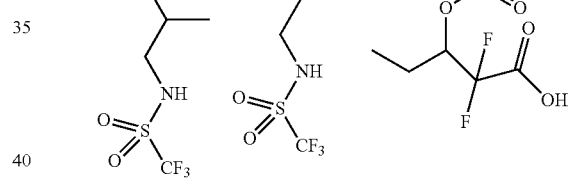
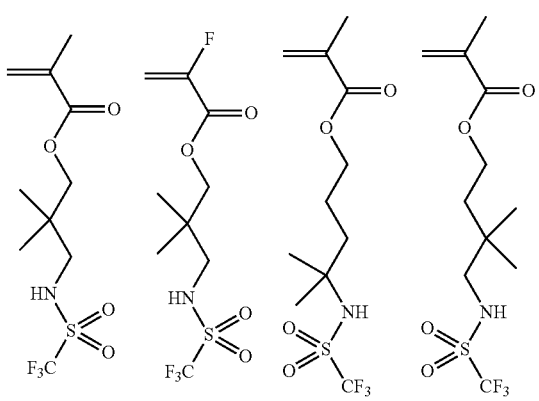
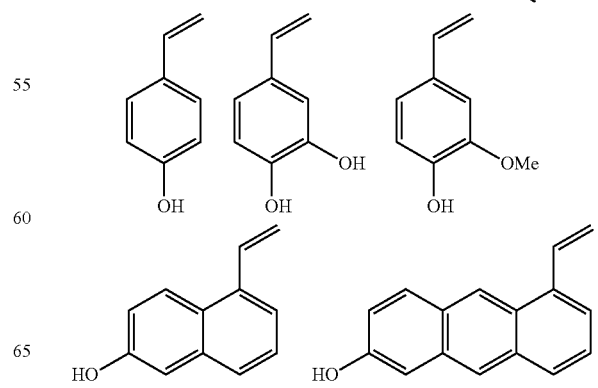

-continued

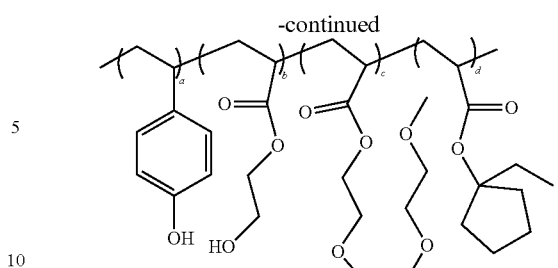

wherein a, b, c, and d represent the mole fractions for the respective repeating units of the polymer.

The polymer typically has a weight average molecular weight ($M_w$) from 1,000 to 50,000 Dalton (Da), preferably from 2,000 to 30,000 Da, more preferably 4,000 to 25,000 Da, and still more preferably from 5,000 to 25,000 Da. The polydispersity index (PDI) of the first polymer, which is the ratio of $M_w$ to number average molecular weight ($M_n$) is typically from 1.1 to 3, and more typically from 1.1 to 2. Molecular weight values are determined by gel permeation chromatography (GPC) using polystyrene standards.

The polymer may be prepared using any suitable method(s) in the art. For example, one or more monomers corresponding to the repeating units described herein may be combined, or fed separately, using suitable solvent(s) and initiator, and polymerized in a reactor. For example, the polymer may be obtained by polymerization of the respective monomers under any suitable conditions, such as by heating at an effective temperature, irradiation with actinic radiation at an effective wavelength, or a combination thereof.

The photoresist composition further comprises a photoacid generator (PAG). Suitable PAGs can generate an acid that, during post-exposure bake (PEB), causes cleavage of acid-labile groups present on a polymer of the photoresist composition. The PAG may be in non-polymeric form or in polymeric form, for example, present in a polymerized repeating unit of the polymer as described above, or as part of a different polymer. In some embodiments, the PAG may be included in the composition as a non-polymerized PAG compound, as a repeating unit of a polymer having a PAG moiety that is derived from a polymerizable PAG monomer, or as a combination thereof.

Suitable non-polymeric PAG compounds may have Formula $G^+A^-$, wherein $G^+$ is an organic cation chosen from iodonium cations substituted with two alkyl groups, two aryl groups, or a combination of alkyl and aryl groups; and sulfonium cations substituted with three alkyl groups, three aryl groups, or a combination of alkyl and aryl groups, and $A^-$ is a non-polymerizable organic anion. Particularly suitable non-polymeric organic anions include those, the conjugated acids of which have a pKa of from −15 to 1. Particularly preferred anions are fluorinated alkyl sulfonates and fluorinated sulfonimides.

Useful non-polymeric PAG compounds are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; di-t-butyphenyliodonium perfluorobutanesulfonate, and di-t-butyphenyliodonium camphorsulfonate. Non-ionic sulfonates and sulfonyl compounds are also known to function as photoacid

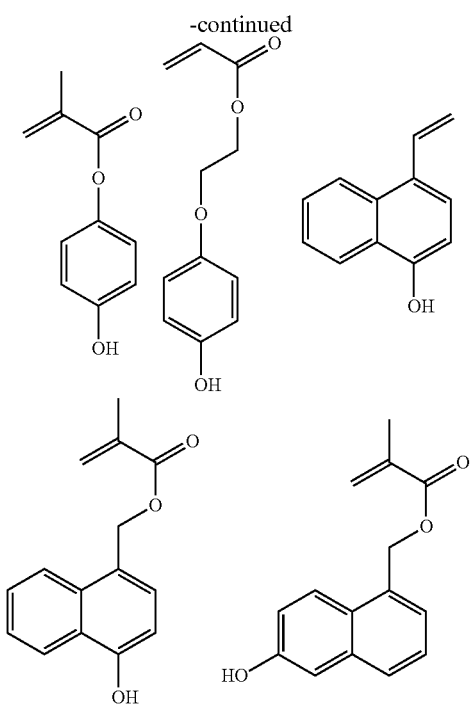

wherein $Y^1$ is as described above, and $R^i$ is as defined for $R^g$ in Formulae (9)-(11).

When present, the polymer typically comprises a base-soluble repeating unit in an amount from 1 to 60 mol %, typically from 5 to 50 mol %, more typically from 5 to 40 mol %, based on total repeating units in the polymer.

Non-limiting exemplary polymers of the present invention include one or more of the following:

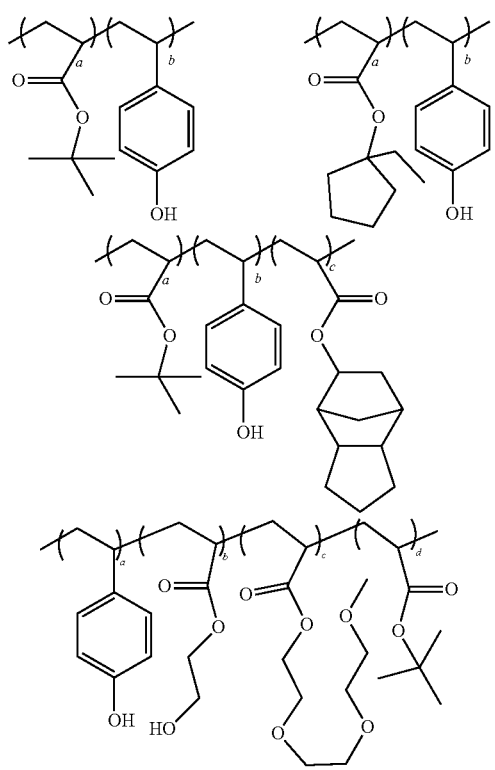

generators, e.g., nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. Suitable non-polymerized photoacid generators are further described in U.S. Pat. No. 8,431,325 to Hashimoto et al. in column 37, lines 11-47 and columns 41-91. Other suitable sulfonate PAGs include sulfonated esters and sulfonyloxy ketones, nitrobenzyl esters, s-triazine derivatives, benzoin tosylate, t-butylphenyl α-(p-toluenesulfonyloxy) acetate, and t-butyl α-(p-toluenesulfonyloxy) acetate; as described in U.S. Pat. Nos. 4,189,323 and 8,431,325.

Typically, when the photoresist composition includes a non-polymeric photoacid generator, it is present in the photoresist composition in an amount of from 0.3 to 65 wt %, more typically 1 to 20 wt %, based on total solids of the photoresist composition.

In some embodiments, $G^+$ may be a sulfonium cation of Formula (13) or an iodonium cation of Formula (14):

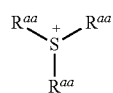

(13)

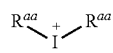

(14)

In Formulae (13) and (14), each $R^{aa}$ is independently substituted or unsubstituted $C_{1-20}$ alkyl, substituted or unsubstituted $C_{3-20}$ cycloalkyl, substituted or unsubstituted $C_{2-20}$ alkenyl, substituted or unsubstituted $C_{6-30}$ aryl, substituted or unsubstituted $C_{3-30}$ heteroaryl, substituted or unsubstituted $C_{7-20}$ arylalkyl, or substituted or unsubstituted $C_{4-20}$ heteroarylalkyl. Each $R^{aa}$ may be either separate or connected to another group $R^{aa}$ via a single bond or a divalent linking group to form a ring. Each $R^{aa}$ optionally may include as part of its structure a divalent linking group. Each $R^{aa}$ independently may optionally comprise an acid-labile group chosen, for example, from tertiary alkyl ester groups, secondary or tertiary aryl ester groups, secondary or tertiary ester groups having a combination of alkyl and aryl groups, tertiary alkoxy groups, acetal groups, or ketal groups.

Exemplary sulfonium cations of Formula (13) may include one or more of the following:

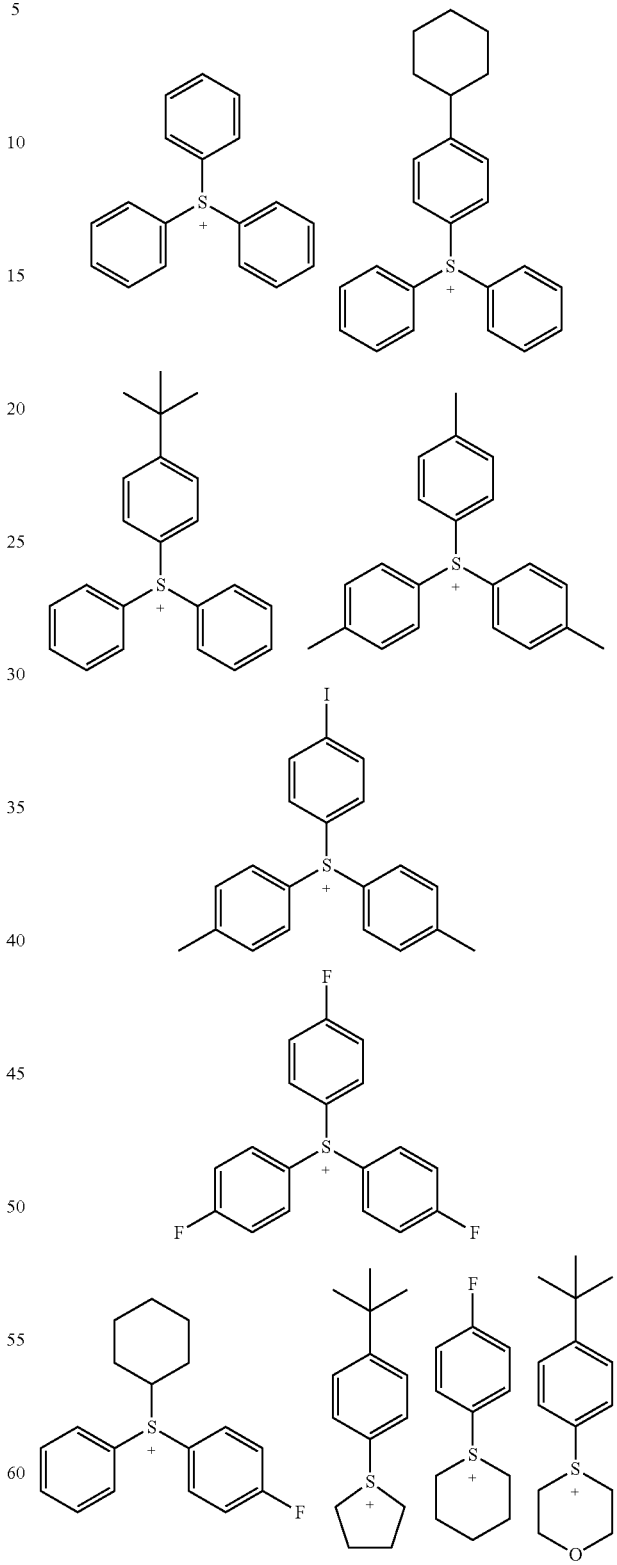

33
-continued
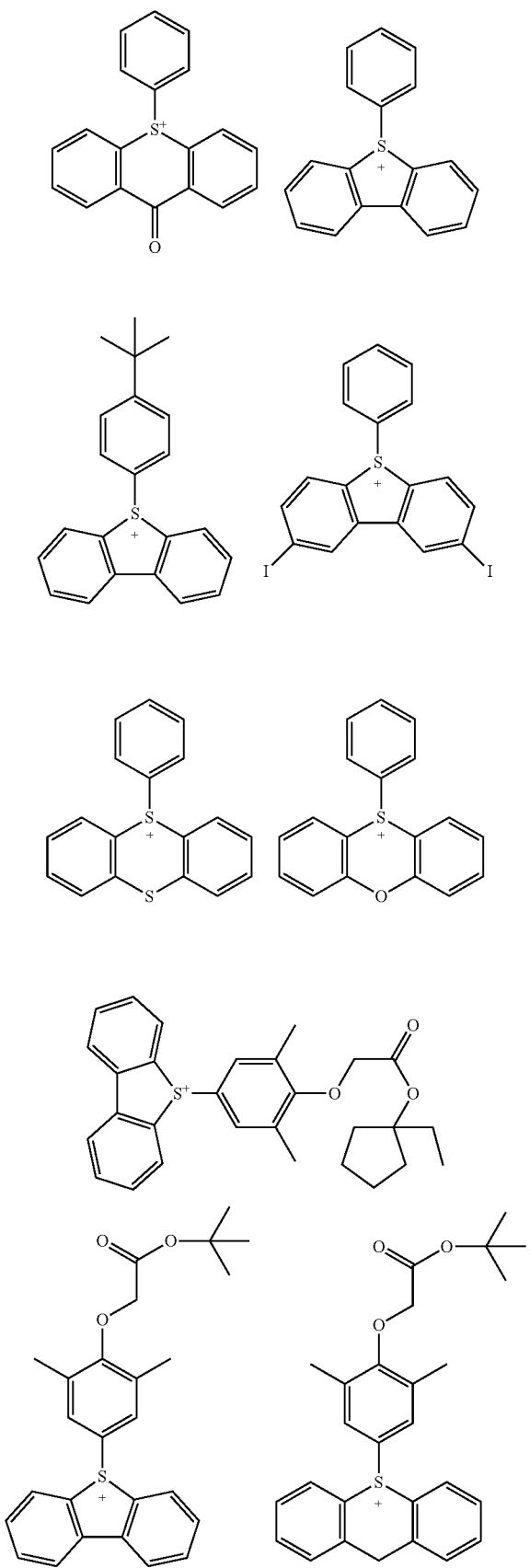
34
-continued
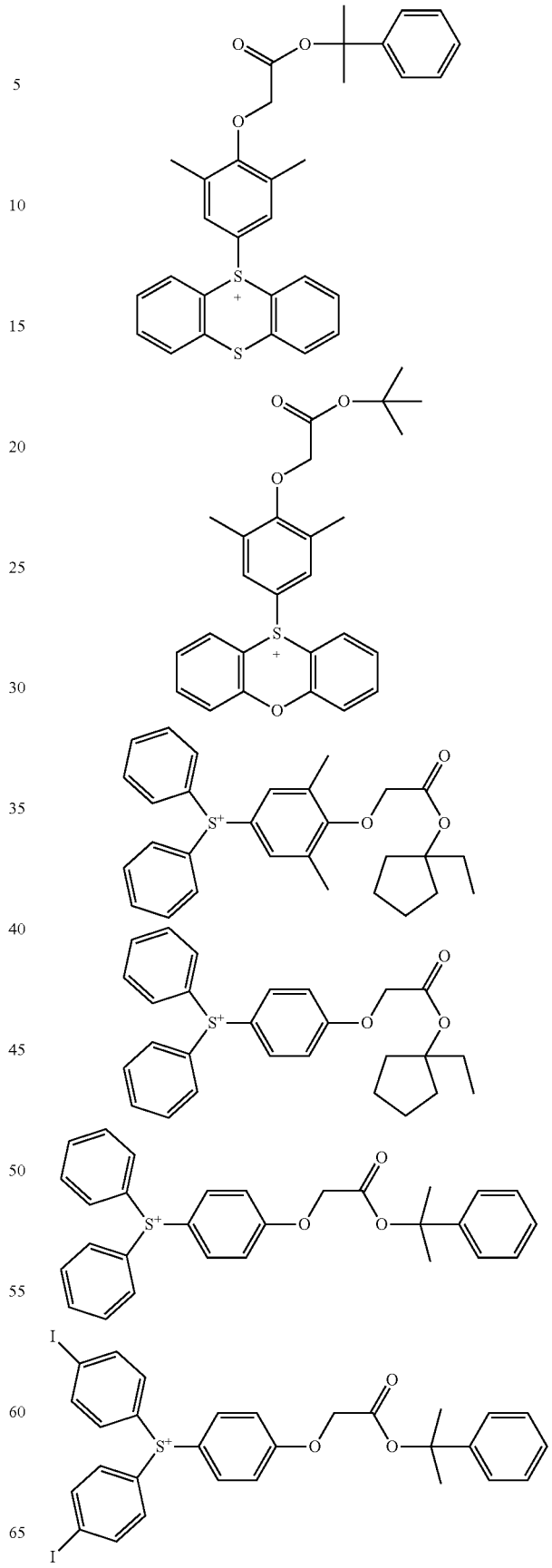

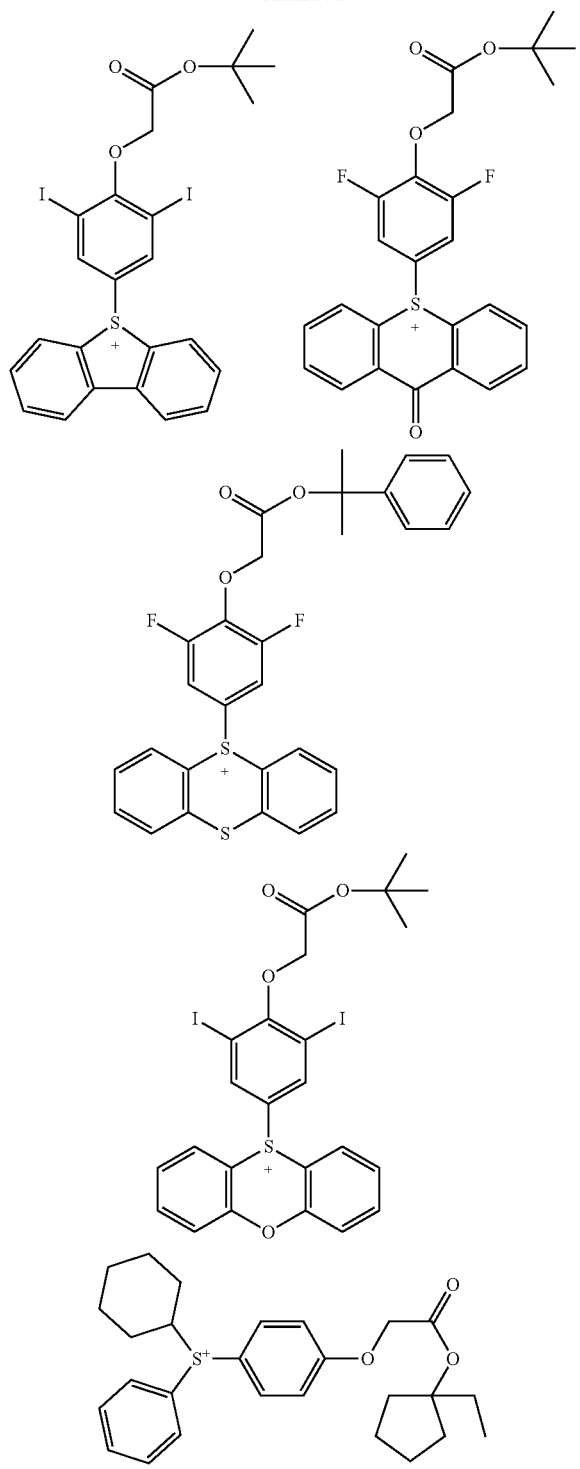
Exemplary iodonium cations of Formula (14) may include one or more of the following:
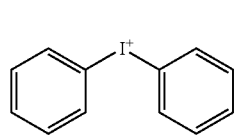
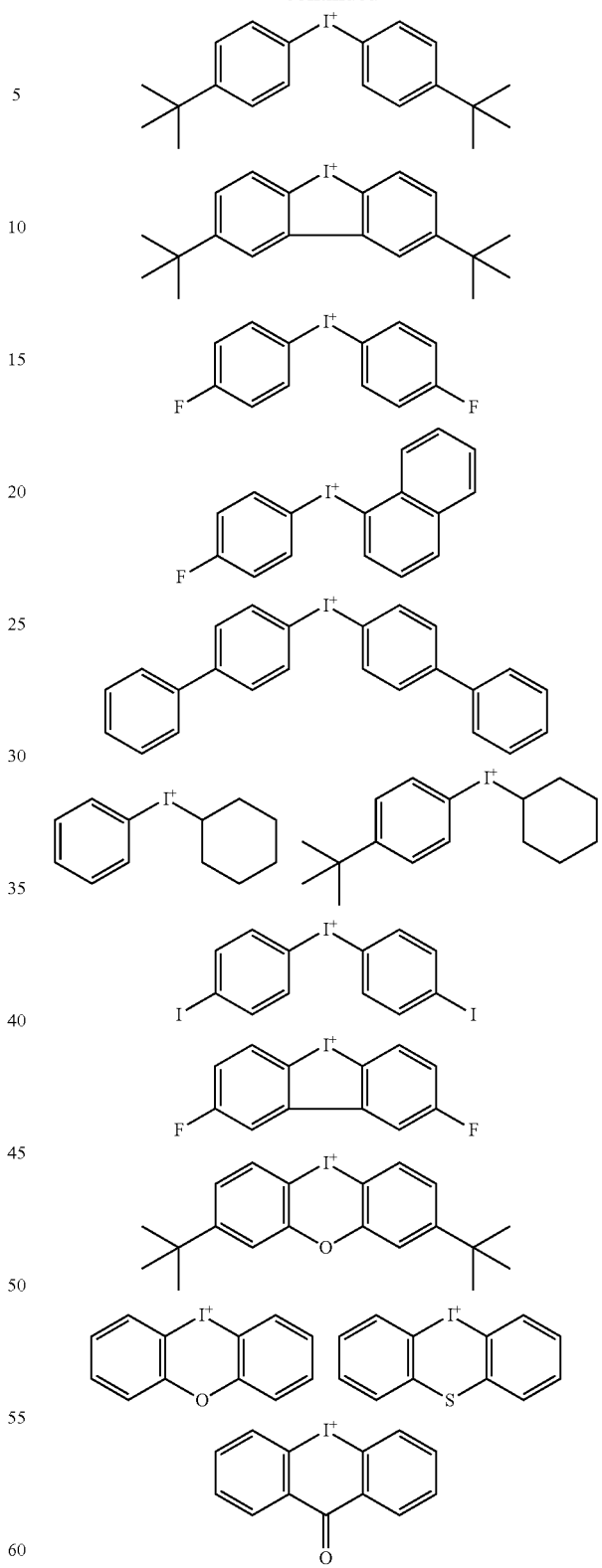
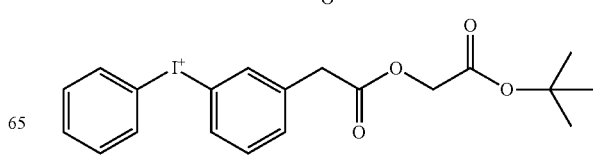

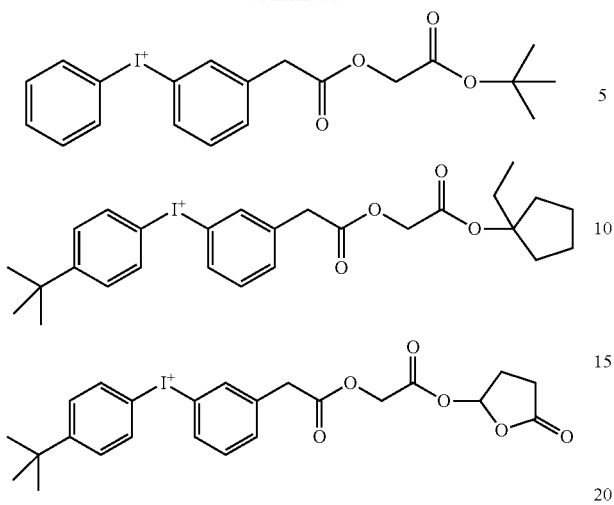
PAGs that are onium salts typically comprise an organic anion having a sulfonate group or a non-sulfonate-type group, such as sulfonamidate, sulfonimidate, methide, or borate.
Exemplary organic anions having a sulfonate group include one or more of the following:
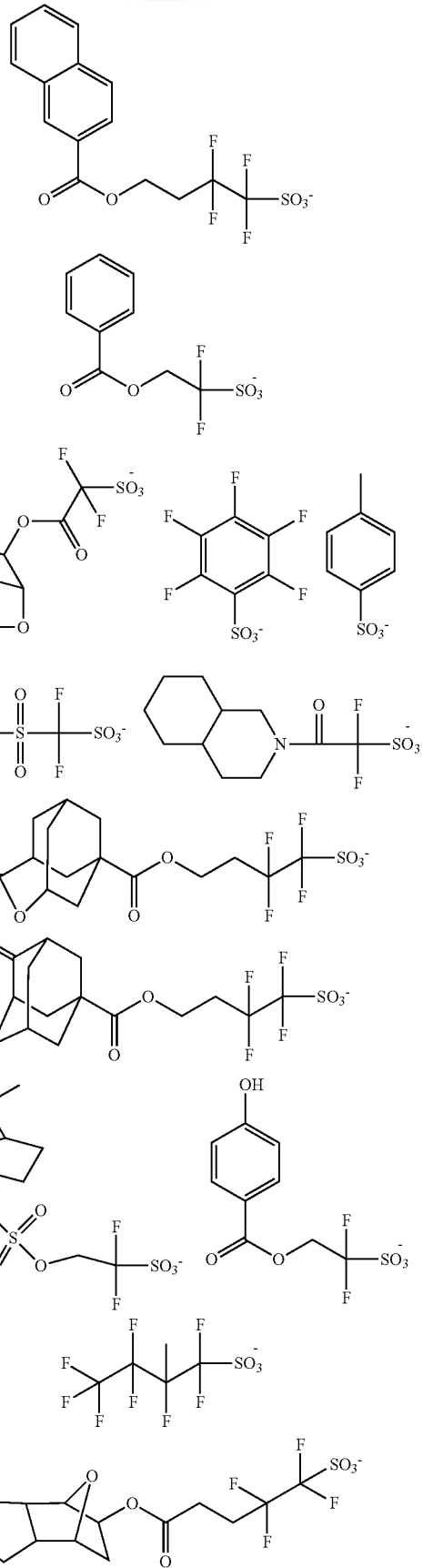

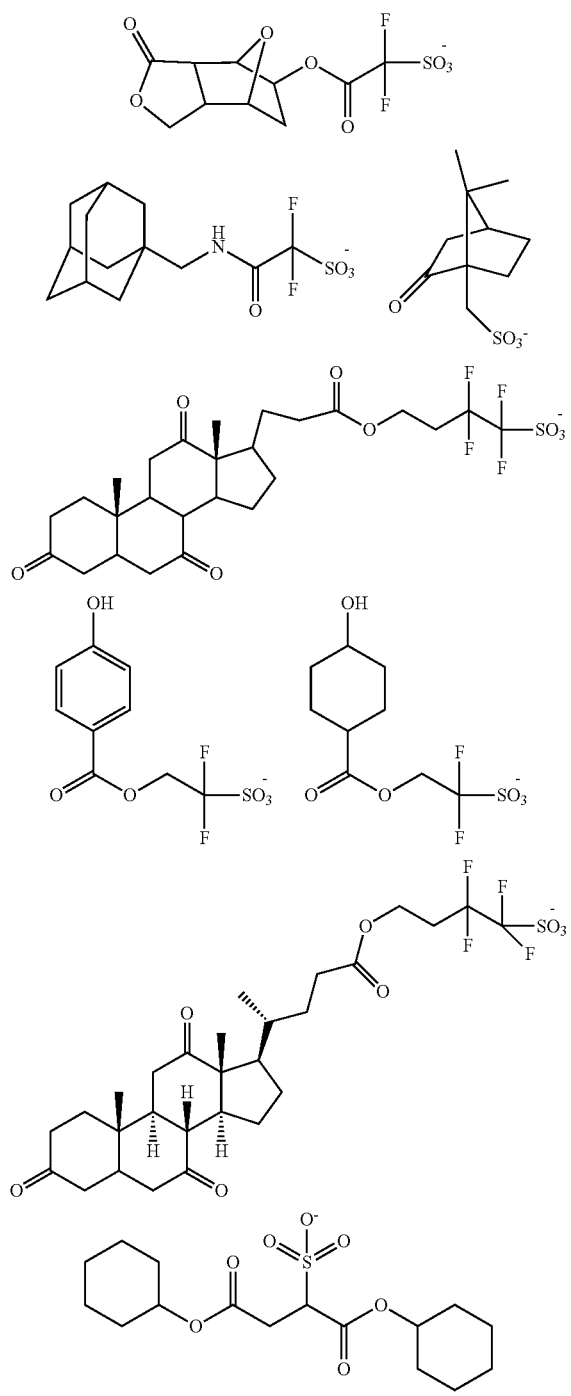
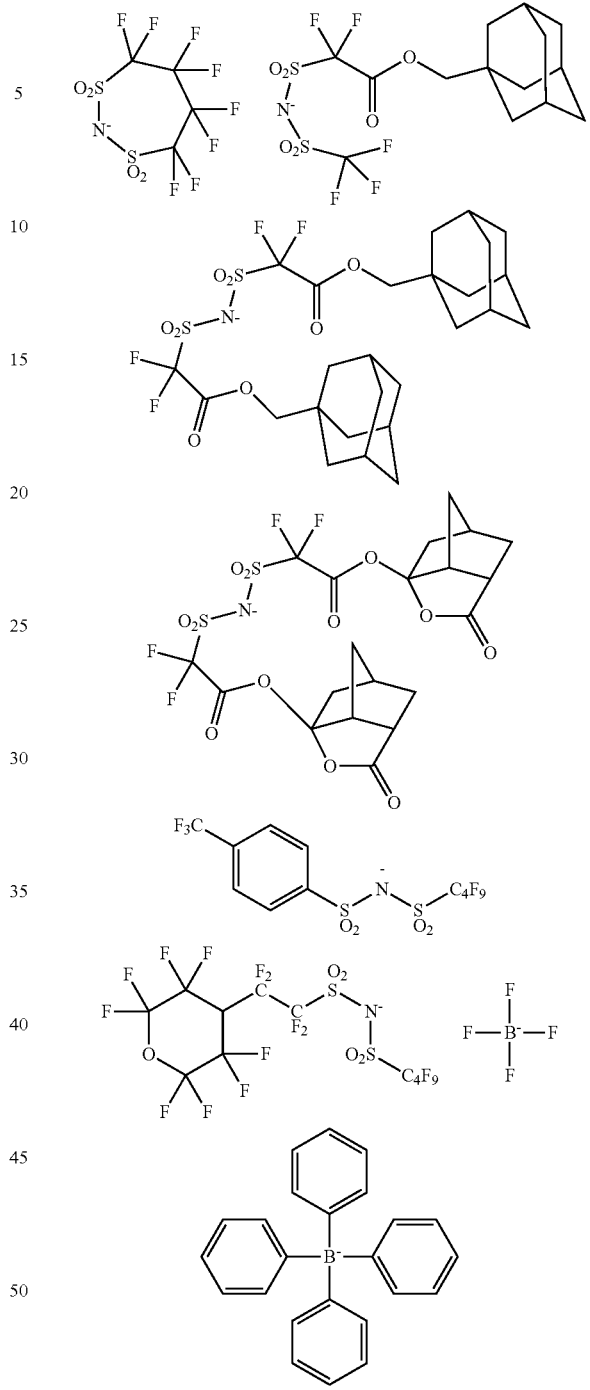

Exemplary non-sulfonated anions include one or more of the following:

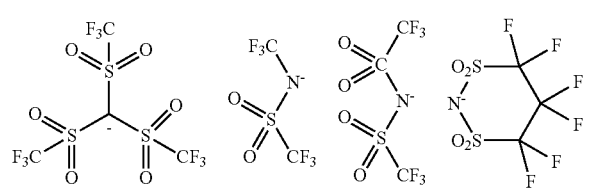

The photoresist composition may optionally comprise a plurality of PAGs. The plurality of PAGs may be polymeric, non-polymeric, or may include both polymeric and non-polymeric PAGs. Preferably, each PAG of the plurality of PAGs is non-polymeric.

In one or more aspects, the photoresist composition may include a first photoacid generator that includes a sulfonate group on the anion, and the photoresist composition may include a second photoacid generator that is non-polymeric, wherein the second photoacid generator may include an anion that is free of sulfonate groups.

In some aspects, the polymer optionally may further include a repeating unit that comprises a PAG-containing moiety, for example a repeating unit derived from one or more monomers of Formula (15):

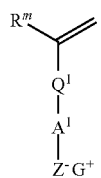

In Formula (15), $R^m$ may be hydrogen, fluorine, cyano, or substituted or unsubstituted $C_{1-10}$ alkyl. Preferably, $R^m$ is hydrogen, fluorine, or substituted or unsubstituted $C_{1-5}$ alkyl, typically methyl. $Q^1$ may be a single bond or a divalent linking group. Preferably, $Q^1$ may include 1 to 10 carbon atoms and at least one heteroatom, more preferably —C(O)—O—.

In Formula (15), $A^1$ may be one or more of substituted or unsubstituted $C_{1-30}$ alkylene, substituted or unsubstituted $C_{3-30}$ cycloalkylene, substituted or unsubstituted $C_{3-30}$ heterocycloalkylene, substituted or unsubstituted $C_{6-30}$ arylene, or substituted or unsubstituted $C_{3-30}$ heteroarylene. Preferably, $A^1$ may be a divalent $C_{1-30}$ perfluoroalkylene group that is optionally substituted.

In Formula (15), $Z^-$ is an anionic moiety, the conjugated acid of which typically has a pKa from −15 to 1. For example, $Z^-$ may be a sulfonate, a carboxylate, an anion of a sulfonamide, an anion of a sulfonimide, or a methide anion. Particularly preferred anion moieties are fluorinated alkyl sulfonates and fluorinated sulfonimides.

In Formula (15), $G^+$ is an organic cation as defined above. In some embodiments, $G^+$ is an iodonium cation substituted with two alkyl groups, two aryl groups, or a combination of alkyl and aryl groups; or a sulfonium cation substituted with three alkyl groups, three aryl groups, or a combination of alkyl and aryl groups.

Exemplary monomers of Formula (15) may include one or more of the following:

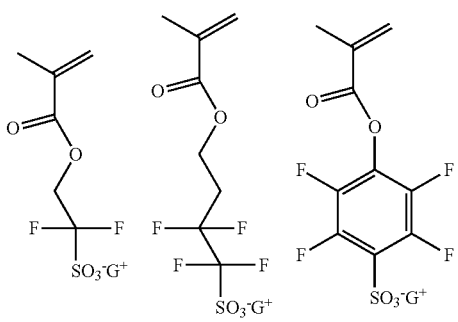

-continued

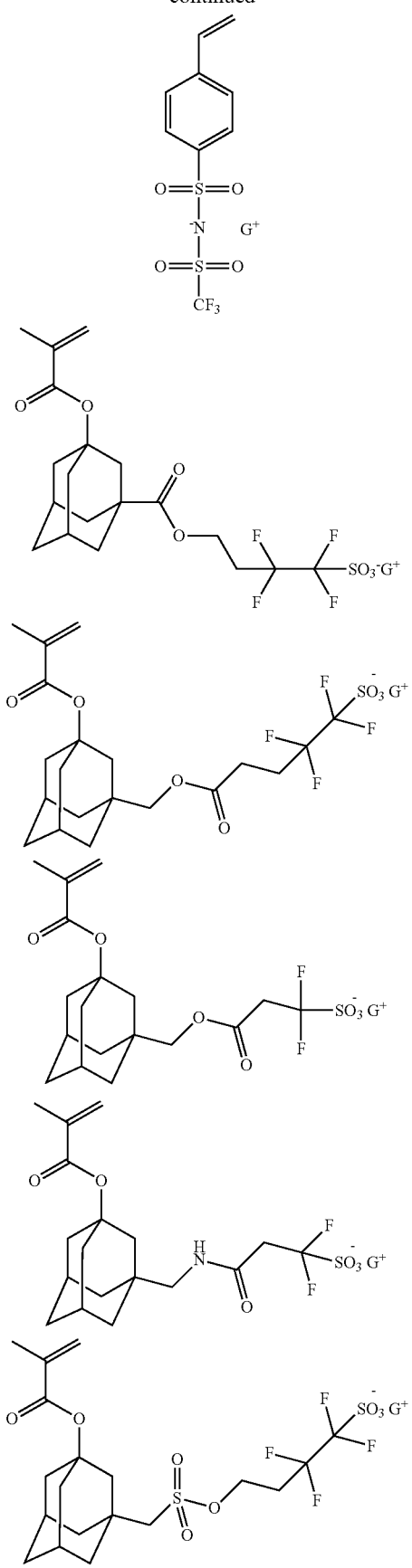

-continued

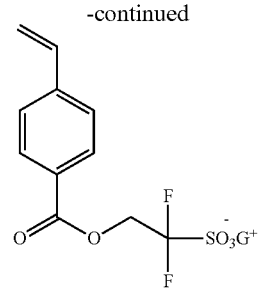

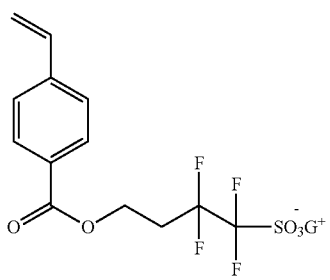

wherein G$^+$ is the organic cation as defined herein.

When used, the repeating unit comprising a PAG moiety can be included in a polymer in an amount from 1 to 15 mol %, typically from 1 to 8 mol %, more typically from 2 to 6 mol %, based on total repeating units in the polymer.

The photoresist composition further includes a solvent for dissolving the components of the composition and to facilitate its coating on a substrate. Preferably, the solvent is an organic solvent conventionally used in the manufacture of electronic devices. Suitable solvents include, for example: aliphatic hydrocarbons such as hexane and heptane; aromatic hydrocarbons such as toluene and xylene; halogenated hydrocarbons such as dichloromethane, 1,2-dichloroethane and 1-chlorohexane; alcohols such as methanol, ethanol, 1-propanol, iso-propanol, tert-butanol, 2-methyl-2-butanol, 4-methyl pentanol, and diacetone alcohol (4-hydroxy-4-methyl-2-pentanone); propylene glycol monomethyl ether (PGME); ethers such as diethyl ether, tetrahydrofuran, 1,4-dioxane, and anisole; ketones such as acetone, methyl ethyl ketone, methyl iso-butyl ketone, 2-heptanone, and cyclohexanone (CHO); esters such as ethyl acetate, n-butyl acetate, propylene glycol monomethyl ether acetate (PGMEA), ethyl lactate (EL), hydroxyisobutyrate methyl ester (HBM), and ethyl acetoacetate; lactones such as gamma-butyrolactone (GBL) and epsilon-caprolactone; lactams such as N-methyl pyrrolidone; nitriles such as acetonitrile and propionitrile; cyclic or non-cyclic carbonate esters such as propylene carbonate, dimethyl carbonate, ethylene carbonate, propylene carbonate, diphenyl carbonate, and propylene carbonate; polar aprotic solvents such as dimethyl sulfoxide and dimethyl formamide; water; and combinations thereof. Of these, preferred solvents are PGME, PGMEA, EL, GBL, HBM, CHO, and combinations thereof.

The total solvent content (i.e., cumulative solvent content for all solvents) in the photoresist compositions is typically from 40 to 99 wt %, for example, from 60 to 99 wt %, or from 85 to 99 wt %, based on total solids of the photoresist composition. The desired solvent content will depend, for example, on the desired thickness of the coated photoresist layer and coating conditions.

The polymer is typically present in the photoresist composition in an amount from 10 to 99.9 wt %, typically from 25 to 99 wt %, and more typically from 40 to 95 wt %, based on total solids of the photoresist composition. It will be understood that "total solids" includes the polymer, PAGs, the additive, and other non-solvent components.

In some aspects, the photoresist composition may further include a material that comprises one or more base-labile groups (a "base-labile material"). As referred to herein, base-labile groups are functional groups that can undergo cleavage reaction to provide polar groups such as hydroxyl, carboxylic acid, sulfonic acid, and the like, in the presence of an aqueous alkaline developer after exposure and post-exposure baking steps. The base-labile group will not react significantly (e.g., will not undergo a bond-breaking reaction) prior to a development step of the photoresist composition that comprises the base-labile group. Thus, for instance, a base-labile group will be substantially inert during pre-exposure soft-bake, exposure, and post-exposure bake steps. By "substantially inert" it is meant that typically of the base-labile groups (or moieties) will decompose, cleave, or react during the pre-exposure soft-bake, exposure, and post-exposure bake steps. The base-labile group is reactive under typical photoresist development conditions using, for example, an aqueous alkaline photoresist developer such as a 0.26 normal (N) aqueous solution of tetramethylammonium hydroxide (TMAH). For example, a 0.26 N aqueous solution of TMAH may be used for single puddle development or dynamic development, e.g., where the 0.26 N TMAH developer is dispensed onto an imaged photoresist layer for a suitable time such as 10 to 120 seconds (s). An exemplary base-labile group is an ester group, typically a fluorinated ester group. Preferably, the base-labile material is substantially not miscible with and has a lower surface energy than the polymer and other solid components of the photoresist composition. When coated on a substrate, the base-labile material can thereby segregate from other solid components of the photoresist composition to a top surface of the formed photoresist layer.

In some aspects, the base-labile material may be a polymeric material, also referred herein as a base-labile polymer, which may include one or more repeating units comprising one or more base-labile groups. For example, the base-labile polymer may comprise a repeating unit comprising 2 or more base-labile groups that are the same or different. A preferred base-labile polymer includes at least one repeating unit comprising 2 or more base-labile groups, for example a repeating unit comprising 2 or 3 base-labile groups.

The base-labile polymer may be a polymer comprising a repeating unit derived from one or more monomers of Formula (16):

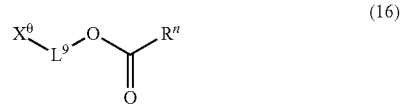

wherein $X^e$ is a polymerizable group selected from vinyl and (meth)acrylic, $L^9$ is a divalent linking group; and $R^a$ is substituted or unsubstituted $C_{1-20}$ fluoroalkyl, provided that the carbon atom bonded to the carbonyl (—C(O)—) in Formula (16) is substituted with at least one fluorine atom.

Exemplary monomers of Formula (16) may include one or more of the following:

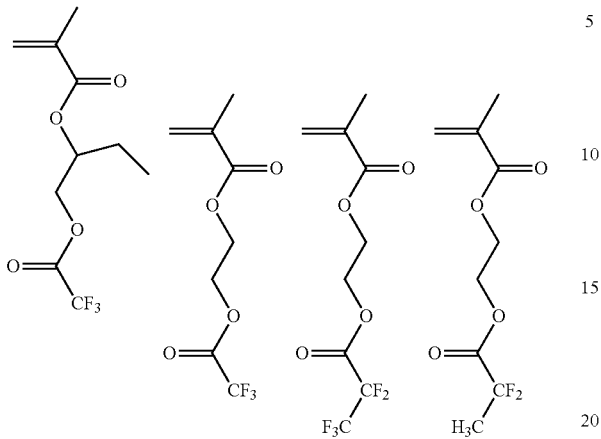

The base-labile polymer may include a repeating unit including two or more base-labile groups. For example, the base-labile polymer can include a repeating unit derived from one or more monomers of Formula (17):

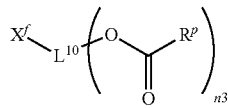

(17)

wherein $X^f$ and $R^p$ are as defined in Formula (16) for $X^e$ and $R^a$, respectively; $L^{10}$ is a polyvalent linking group including one or more of substituted or unsubstituted $C_{1-20}$ alkylene, substituted or unsubstituted $C_{3-20}$ cycloalkylene, —C(O)—, or —C(O)O—; and n3 may be an integer of 2 or greater, for example 2 or 3.

Exemplary monomers of Formula (17) may include one or more of the following:

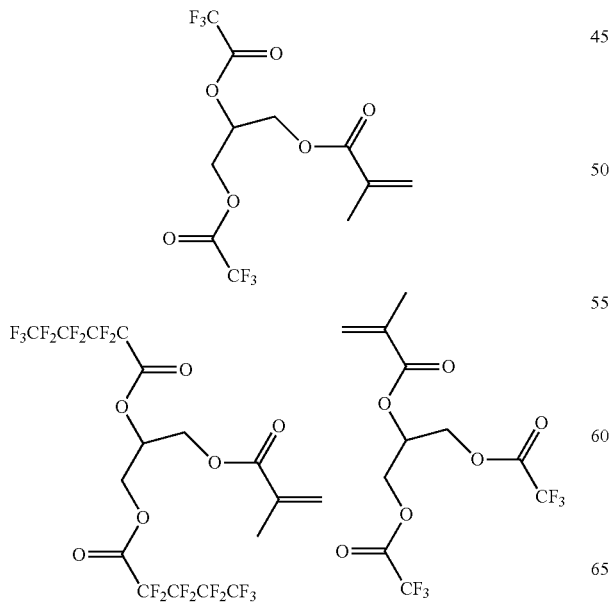

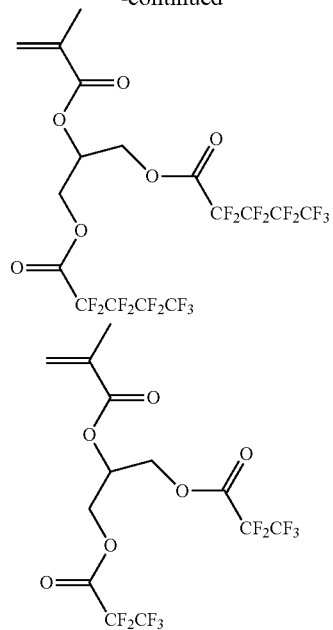

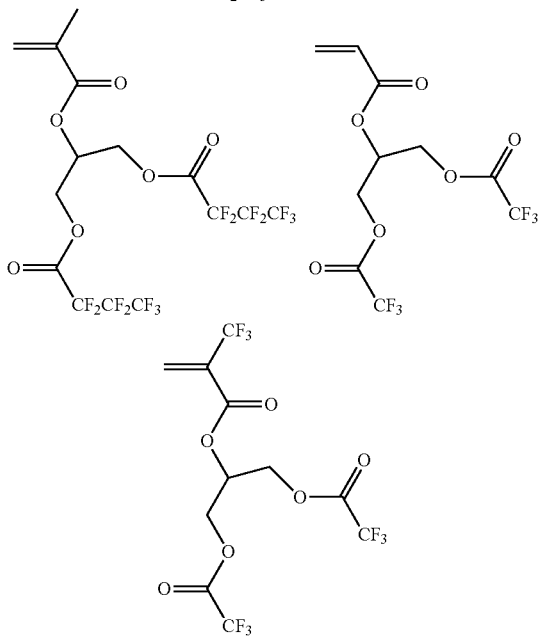

The base-labile polymer may include a repeating unit including one or more base-labile groups. For example, the base-labile polymer can include a repeating unit derived from one or more monomers of Formula (18):

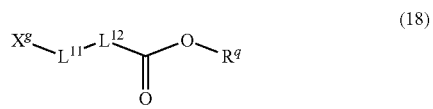

(18)

wherein $X^g$ and $R^q$ are as defined in Formula (16) for $X^e$ and $R^a$, respectively; $L^{11}$ is a divalent linking group; and $L^{12}$ is substituted or unsubstituted $C_{1-20}$ fluoroalkylene wherein the carbon atom bonded to the carbonyl (—C(O)—) in Formula (18) is substituted with at least one fluorine atom.

Exemplary monomers of Formula (18) may include one or more of the following:

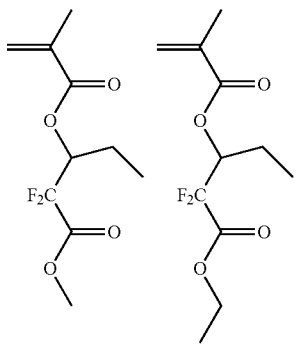

In a further preferred aspect of the invention, a base-labile polymer may comprise one or more base-labile groups and one or more acid-labile groups, such as one or more acid-labile ester moieties (e.g., t-butyl ester) or acid-labile acetal groups. For example, the base-labile polymer may comprise a repeating unit including a base-labile group and an acid-labile group, i.e., wherein both a base-labile group and an acid-labile group are present on the same repeating unit. In another example, the base-labile polymer may comprise a first repeating unit comprising a base-labile group and a second repeating unit comprising an acid-labile group. Preferred photoresists of the invention can exhibit reduced defects associated with a resist relief image formed from the photoresist composition.

The base-labile polymer may be prepared using any suitable methods in the art, including those described herein for the first and second polymers. For example, the base-labile polymer may be obtained by polymerization of the respective monomers under any suitable conditions, such as by heating at an effective temperature, irradiation with actinic radiation at an effective wavelength, or a combination thereof. Additionally, or alternatively, one or more base-labile groups may be grafted onto the backbone of a polymer using suitable methods.

In some aspects, the base-labile material is a single molecule comprising one more base-labile ester groups, preferably one or more fluorinated ester groups. The base-labile materials that are single molecules typically have a $M_W$ in the range from 50 to 1,500 Da. Exemplary base-labile materials include one or more of the following:

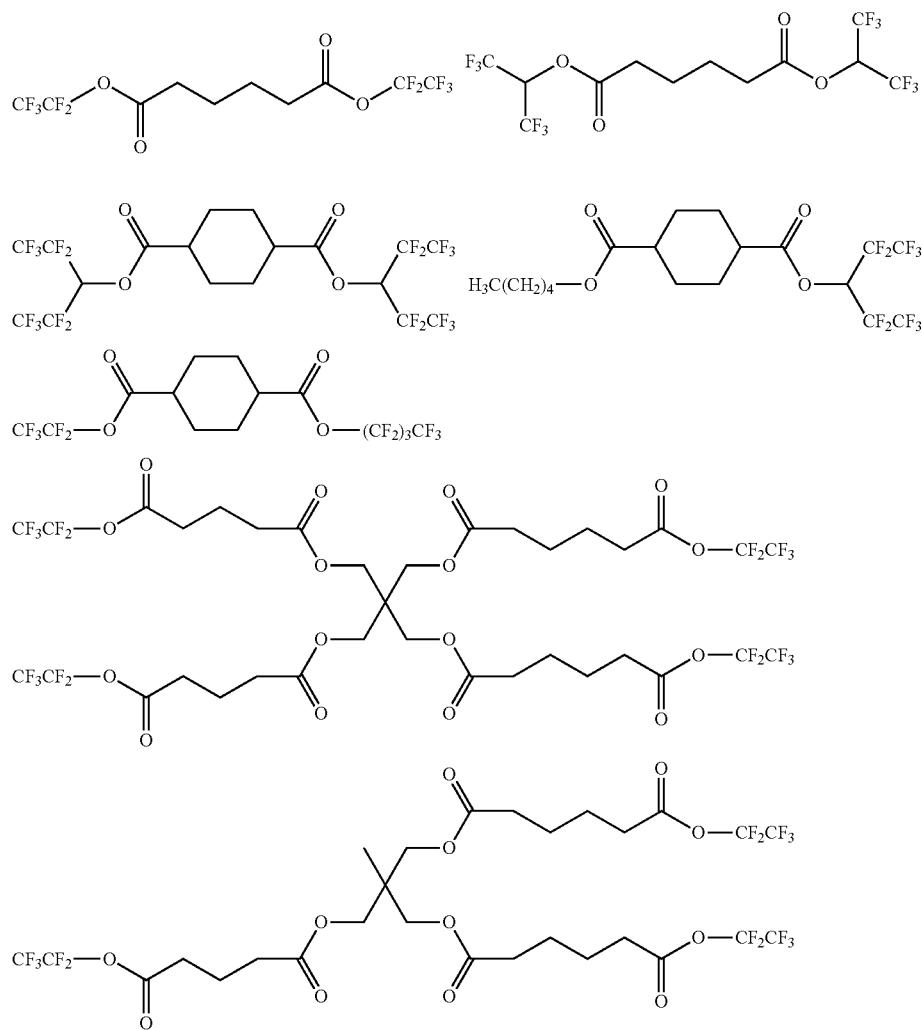

When present, the base-labile polymer is typically present in the photoresist compositions in an amount of from 0.01 to 10 wt %, more typically 1 to 5 wt %, based on total solids of the photoresist composition.

Additionally, or alternatively, to the base-labile polymer, the photoresist compositions may further include one or more polymers in addition to and different from the photoresist polymer described above. For example, the photoresist compositions may include an additional polymer as described above but different in composition, or a polymer that is similar to those described above but does not include each of the requisite repeating units. Additionally, or alternatively, the one or more additional polymers may include those well known in the photoresist art, for example, those chosen from polyacrylates, polyvinylethers, polyesters, polynorbornenes, polyacetals, polyethylene glycols, polyamides, polyacrylamides, polyphenols, novolacs, styrenic polymers, polyvinyl alcohols, or combinations thereof.

The photoresist composition may further include one or more additional, optional additives. For example, optional additives may include actinic and contrast dyes, anti-striation agents, plasticizers, speed enhancers, sensitizers, photo-decomposable quenchers (PDQ) (and, also known as photo-decomposable bases), basic quenchers, thermal acid generators, surfactants, and the like, or combinations thereof. If present, the optional additives are typically present in the photoresist compositions in an amount of from 0.01 to 10 wt %, based on total solids of the photoresist composition.

PDQs generate a weak acid upon irradiation. The acid generated from a photo-decomposable quencher is not strong enough to react rapidly with acid-labile groups that are present in the resist matrix. Exemplary photo-decomposable quenchers include, for example, photo-decomposable cations, and preferably those also useful for preparing strong acid generator compounds, paired with an anion of a weak acid (pKa>1) such as, for example, an anion of a $C_{1-20}$ carboxylic acid or $C_{1-20}$ sulfonic acid. Exemplary carboxylic acids include formic acid, acetic acid, propionic acid, tartaric acid, succinic acid, cyclohexanecarboxylic acid, benzoic acid, salicylic acid, and the like. Exemplary sulfonic acids include p-toluene sulfonic acid, camphor sulfonic acid and the like. In a preferred embodiment, the photo-decomposable quencher is a photo-decomposable organic zwitterion compound such as diphenyliodonium-2-carboxylate.

The photo-decomposable quencher may be in non-polymeric or polymer-bound form. When in polymeric form, the photo-decomposable quencher is present in polymerized units on the first polymer or second polymer. The polymerized units containing the photo-decomposable quencher are typically present in an amount from 0.1 to 30 mole %, preferably from 1 to 10 mole % and more preferably from 1 to 2 mole %, based on total repeating units of the polymer.

Exemplary basic quenchers include, for example, linear aliphatic amines such as tributylamine, trioctylamine, triisopropanolamine, tetrakis(2-hydroxypropyl)ethylenediamine: n-tert-butyldiethanolamine, tris(2-acetoxy-ethyl) amine, 2,2',2",2'''-(ethane-1,2-diylbis(azanetriyl))tetraethanol, 2-(dibutylamino)ethanol, and 2,2',2"-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate, and N-(2-acetoxy-ethyl) morpholine; aromatic amines such as pyridine, di-tert-butyl pyridine, and pyridinium; linear and cyclic amides and derivatives thereof such as N,N-bis(2-hydroxyethyl)pivalamide, N,N-diethylacetamide, $N^1,N^1,N^3,N^3$-tetrabutylmalonamide, 1-methylazepan-2-one, 1-allylazepan-2-one, and tert-butyl 1,3-dihydroxy-2-(hydroxymethyl)propan-2-ylcarbamate; ammonium salts such as quaternary ammonium salts of sulfonates, sulfamates, carboxylates, and phosphonates; imines such as primary and secondary aldimines and ketimines; diazines such as optionally substituted pyrazine, piperazine, and phenazine; diazoles such as optionally substituted pyrazole, thiadiazole, and imidazole; and optionally substituted pyrrolidones such as 2-pyrrolidone and cyclohexyl pyrrolidine.

The basic quenchers may be in non-polymeric or polymer-bound form. When in polymeric form, the quencher may be present in repeating units of the polymer. The repeating units containing the quencher are typically present in an amount of from 0.1 to 30 mole %, preferably from 1 to 10 mole % and more preferably from 1 to 2 mole %, based on total repeating units of the polymer.

Exemplary surfactants include fluorinated and non-fluorinated surfactants and can be ionic or non-ionic, with non-ionic surfactants being preferable. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova. In an aspect, the photoresist composition further includes a surfactant polymer including a fluorine-containing repeating unit.

Patterning methods using the photoresist compositions of the invention will now be described. Suitable substrates on which the photoresist compositions can be coated include electronic device substrates. A wide variety of electronic device substrates may be used in the present invention, such as: semiconductor wafers; polycrystalline silicon substrates; packaging substrates such as multichip modules; flat panel display substrates; substrates for light emitting diodes (LEDs) including organic light emitting diodes (OLEDs); and the like, with semiconductor wafers being typical. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. Such substrates may be any suitable size. Typical wafer substrate diameters are 200 to 300 millimeters (mm), although wafers having smaller and larger diameters may be suitably employed according to the present invention. The substrates may include one or more layers or structures which may optionally include active or operable portions of devices being formed.

Typically, one or more lithographic layers such as a hardmask layer, for example, a spin-on-carbon (SOC), amorphous carbon, or metal hardmask layer, a CVD layer such as a silicon nitride (SiN), a silicon oxide (SiO), or silicon oxynitride (SiON) layer, an organic or inorganic underlayer, or combinations thereof, are provided on an upper surface of the substrate prior to coating a photoresist composition of the present invention. Such layers, together with an overcoated photoresist layer, form a lithographic material stack.

Optionally, a layer of an adhesion promoter may be applied to the substrate surface prior to coating the photoresist compositions. If an adhesion promoter is desired, any suitable adhesion promoter for polymer films may be used, such as silanes, typically organosilanes such as trimethoxyvinylsilane, triethoxyvinylsilane, hexamethyldisilazane, or an aminosilane coupler such as gamma-aminopropyltriethoxysilane. Particularly suitable adhesion promoters include those sold under the AP 3000, AP 8000, and AP 9000S designations, available from DuPont Electronics & Imaging (Marlborough, Massachusetts).

The photoresist composition may be coated on the substrate by any suitable method, including spin coating, spray coating, dip coating, doctor blading, or the like. For example, applying the layer of photoresist may be accomplished by spin coating the photoresist in solvent using a coating track, in which the photoresist is dispensed on a spinning wafer. During dispensing, the wafer is typically spun at a speed of up to 4,000 rotations per minute (rpm), for example, from 200 to 3,000 rpm, for example, 1,000 to 2,500 rpm, for a period from 15 to 120 seconds to obtain a layer of the photoresist composition on the substrate. It will be appreciated by those skilled in the art that the thickness of the coated layer may be adjusted by changing the spin speed and/or the total solids of the composition. A photoresist composition layer formed from the compositions of the invention typically has a dried layer thickness from 3 to 30 micrometers (μm), preferably from greater than 5 to 30 μm, and more preferably from 6 to 25 μm.

The photoresist composition is typically next soft-baked to minimize the solvent content in the layer, thereby forming a tack-free coating and improving adhesion of the layer to the substrate. The soft bake is performed, for example, on a hotplate or in an oven, with a hotplate being typical. The soft bake temperature and time will depend, for example, on the photoresist composition and thickness. The soft bake temperature is typically from 80 to 170° C., and more typically from 90 to 150° C. The soft bake time is typically from 10 seconds to 20 minutes, more typically from 1 minute to 10 minutes, and still more typically from 1 minute to 2 minutes. The heating time can be readily determined by one of ordinary skill in the art based on the ingredients of the composition.

The photoresist layer is next pattern-wise exposed to activating radiation to create a difference in solubility between exposed and unexposed regions. Reference herein to exposing a photoresist composition to radiation that is activating for the composition indicates that the radiation can form a latent image in the photoresist composition. The exposure is typically conducted through a patterned photomask that has optically transparent and optically opaque regions corresponding to regions of the resist layer to be exposed and unexposed, respectively. Such exposure may, alternatively, be conducted without a photomask in a direct writing method, typically used for e-beam lithography. The activating radiation typically has a wavelength of sub-400 nm, sub-300 nm or sub-200 nm, with 248 nm (KrF), 193 nm (ArF), 13.5 nm (EUV) wavelengths ore-beam lithography being preferred. Preferably, the activating radiation is 248 nm radiation. The methods find use in immersion or dry (non-immersion) lithography techniques. The exposure energy is typically from 1 to 200 millijoules per square centimeter (mJ/cm$^2$), preferably from 10 to 100 mJ/cm$^2$ and more preferably from 20 to 50 mJ/cm$^2$, dependent upon the exposure tool and components of the photoresist composition.

Following exposure of the photoresist layer, a post-exposure bake (PEB) of the exposed photoresist layer is performed. The PEB can be conducted, for example, on a hotplate or in an oven, with a hotplate being typical. Conditions for the PEB will depend, for example, on the photoresist composition and layer thickness. The PEB is typically conducted at a temperature from 70 to 150° C., preferably from 75 to 120° C., and a time from 30 to 120 seconds. A latent image defined by the polarity-switched (exposed regions) and unswitched regions (unexposed regions) is formed in the photoresist.

The exposed photoresist layer is then developed with a suitable developer to selectively remove those regions of the layer that are soluble in the developer while the remaining insoluble regions form the resulting photoresist pattern relief image. In the case of a positive-tone development (PTD) process, the exposed regions of the photoresist layer are removed during development and unexposed regions remain. Conversely, in a negative-tone development (NTD) process, the exposed regions of the photoresist layer remain, and unexposed regions are removed during development. Application of the developer may be accomplished by any suitable method such as described above with respect to application of the photoresist composition, with spin coating being typical. The development time is for a period effective to remove the soluble regions of the photoresist, with a time of from 5 to 60 seconds being typical. Development is typically conducted at room temperature.

Suitable developers for a PTD process include aqueous base developers, for example, quaternary ammonium hydroxide solutions such as tetramethylammonium hydroxide (TMAH), preferably 0.26 normal (N) TMAH, tetraethylammonium hydroxide, tetrabutylammonium hydroxide, sodium hydroxide, potassium hydroxide, sodium carbonate, potassium carbonate, and the like. Suitable developers for an NTD process are organic solvent-based, meaning the cumulative content of organic solvents in the developer is 50 wt % or more, typically 95 wt % or more, 98 wt % or more, or 100 wt %, based on total weight of the developer. Suitable organic solvents for the NTD developer include, for example, those chosen from ketones, esters, ethers, hydrocarbons, and mixtures thereof. The developer is typically 2-heptanone or n-butyl acetate.

A coated substrate may be formed from the photoresist compositions of the invention. Such a coated substrate includes: (a) a substrate having one or more layers to be patterned on a surface thereof; and (b) a layer of the photoresist composition over the one or more layers to be patterned.

The photoresist pattern may be used, for example, as an etch mask, thereby allowing the pattern to be transferred to one or more sequentially underlying layers by known etching techniques, typically by dry-etching such as reactive ion etching The photoresist pattern may, for example, be used for pattern transfer to an underlying hardmask layer which, in turn, is used as an etch mask for pattern transfer to one or more layers below the hardmask layer. If the photoresist pattern is not consumed during pattern transfer, it may be removed from the substrate by known techniques, for example, oxygen plasma ashing. The photoresist compositions may, when used in one or more such patterning processes, be used to fabricate semiconductor devices such as memory devices, processor chips (CPUs), graphics chips, optoelectronic chips, LEDs, OLEDs, as well as other electronic devices.

The invention is further illustrated by the following examples.

EXAMPLES

Example 1 and Comparative Example 1

Photoresist compositions of Example 1 and Comparative Example 1 were prepared by combining the components indicated in Table 1, where the amounts are expressed in weight percent (wt %) based on 100 wt % of total non-solvent components of the photoresist composition (i.e., 100 wt % of total solids). The photoresist compositions were prepared in a solvent mixture of propylene glycol monomethyl ether acetate (PGMEA), propylene glycol monomethyl ether (PGME), and gamma-butyrolactone (gBL) in a weight ratio of 75:20:5.

TABLE 1

| | Polymer | PAG | Quenchers | Additive | Surfactant |
|---|---|---|---|---|---|
| Comparative Example 1 (43% total solids) | P1 (98.122%) | PAG1 (1.870%) | Q1 (0.00458%) Q2 (0.00397%) | — | SLA (0.050%) |
| Example 1 (44% total solids) | P1 (88.309%) | PAG1 (1.870%) | Q1 (0.00458%) Q2 0.00397% | A1 (10%) | SLA (0.050%) |

The additive (A1) was gamma-methyl decalactone. The surfactant (SLA) was POLYFOX PF-656 (Omnova Solutions Inc.).

The polymer (P1) has the following structure:

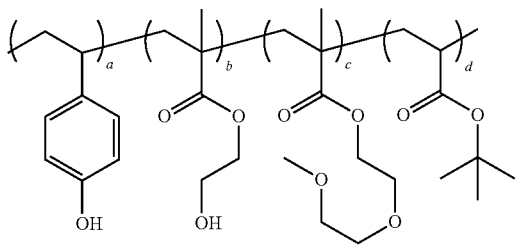

wherein a is 64.2 mol %, b is 5.1 mol %, c is 24.3 mol %, and d is 24.3 mol %, based on 100 mol % total repeating units. Polymer 1 had an $M_w$ of 21 kDa and a PDI of 1.69.

The structures of the photoacid generator (PAG1), quencher (Q1), and quencher (Q2) are as follows:

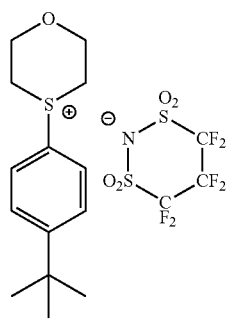

PAG1

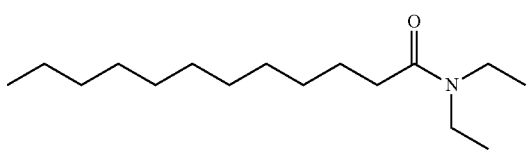

Q1

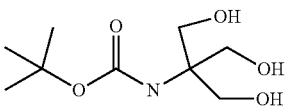

Q2

Photospeed. KrF contrast and lithographic evaluations were carried out on 200 mm silicon wafers using a TEL Mark 8 track (Tokyo Electron). The silicon wafers were primed with HMDS (125° C. for 60 seconds) and then spin-coated with the photoresist composition of Example 1 or Comparative Example 1. The coated wafers were baked at 150° C. for 200 seconds to provide a photoresist layer having a film thickness of about 15 μm. The photoresist-coated wafers were then exposed to KrF radiation (248 nm) using an ASML300 KrF stepper through using a numerical aperture of 0.6 NA/0.65 σ and without a mask. The exposed wafers were post-exposure baked at 110° C. for 120 seconds and developed using a 0.26 N tetramethylammonium hydroxide (TMAH) solution (DuPont Electronics & Imaging) for 120 seconds to form resist patterns. The remaining photoresist layer thickness (μm) at different exposure doses (mJ/cm$^2$) were measured using a F50-UVX Film Mapping System (Filmetrics). The data were evaluated by plotting the remaining film thickness as a function of exposure dose to obtain KrF positive tone contrast curves. The contrast curves were used to determine the clearing dose ($E_0$) which is the minimum dose that is required to clear the film completely.

The value of $E_0$ of each formulation is shown in Table 2.

TABLE 2

| | Additive | $E_0$ (mJ/cm$^2$) |
|---|---|---|
| Comparative Example 1 | — | 28 |
| Example 1 | A1 (10%) | 16 |

As demonstrated by the data shown in Table 2, the inventive additive enhanced the E0 clearing dose of the photoresist composition of Example 1. Hence, the inventive Example 1 achieved a faster photospeed compared to the photospeed when using Comparative Example 1.

Delamination. 200 mm silicon wafers were primed with HMDS (125° C. for 60 seconds) and spin-coated with the photoresist composition of Example 1 or Comparative Example 1. The wafers were baked at 150° C. for 200 seconds to provide a film having a thickness of 15 μm. The photoresist-coated wafers were then exposed to 248 nm radiation using ES4 Stepper (Cannon) with a binary mask using 0.6 NA/0.65 σ. The exposed wafers were post-exposure baked at 110° C. for 120 seconds and then developed using a 0.26 N solution of TMAH for 120 seconds. Cross-section images of the isolated line pattern were obtained using an AMRAY4200 scanning electron microscope (KLA-Tencor) operated at 15 kV. The top-down images revealed that the gamma-methyl-decalactone additive of Example 1 improved adhesion performance of thick photoresists for KrF patterning.

Example 2 and Comparative Example 2

Photoresist compositions of Example 2 and Comparative Example 2 were prepared by combining the components as indicated in Table 3, where the amounts are expressed in weight percent (wt %) based on 100 wt % of total non-solvent components of the photoresist composition (i.e., 100 wt % of total solids). The photoresist compositions were prepared in a solvent mixture of PGMEA and PGME in a weight ratio of 60:40.

TABLE 3

|  | Polymer | PAG | Quenchers | Additive | Surfactant |
|---|---|---|---|---|---|
| Comparative Example 2 (37.3% total solids) | P1 (85.992%) | PAG1 (1.092%) | Q1 (0.00922%) Q2 (0.00799%) | A2 (12.899%) | SLA (0.050%) |
| Example 2 (37.3% total solids) | P1 (85.992%) | PAG1 (1.092%) | Q1 (0.00922%) Q2 (0.00799%) | A3 (12.899%) | SLA (0.050%) |

The structures of P1, PAG1, Q1, Q2, and SLA are the same as defined above.

The additives (A2) and (A3) had the following structures:

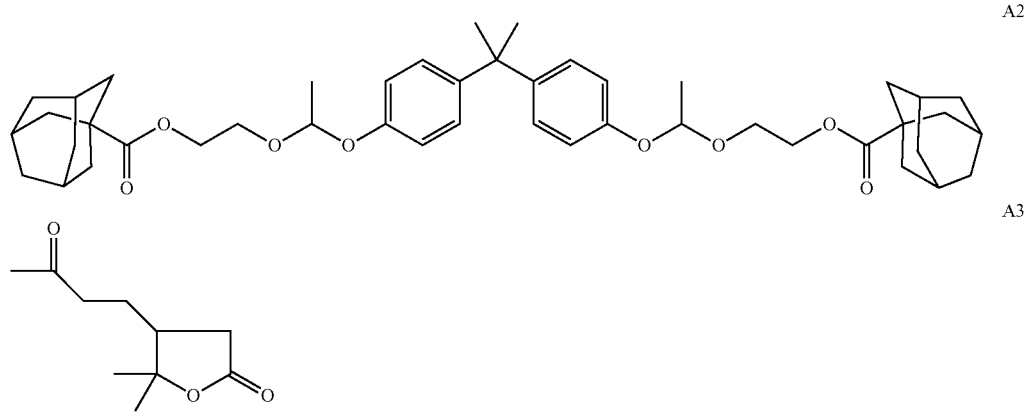

Photospeed Evaluation. KrF contrast and lithographic evaluations for Example 2 and Comparative Example 2 were performed as described above for Example 1 and Comparative Example 1.

From these experiments, it was found that the E0 clearing dose for Example 2 was 14 mJ/cm$^2$, whereas the E0 clearing dose for Comparative Example 2 was 20 mJ/cm$^2$. As demonstrated by the data, the substituted lactone additive having formula A3 enhanced the photospeed of the photoresist composition of Example 2.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A photoresist composition, comprising:
   a polymer;
   a photoacid generator;
   an additive of Formula (1a); and
   a solvent:

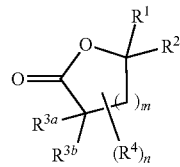

wherein, in Formula (1a),
$R^1$ and $R^2$ are each independently substituted or unsubstituted $C_{1-4}$ alkyl, substituted or unsubstituted $C_{1-20}$ heteroalkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl;
each of $R^1$ and $R^2$ optionally further comprises as part of their structure one or more groups selected from —O—, —C(O)—, —S—, —S(O)$_2$—, and —N($R^{1a}$)—, wherein $R^{1a}$ is hydrogen, substituted or unsubstituted $C_{1-20}$ alkyl, substituted or unsubstituted $C_{3-20}$ cycloalkyl, or substituted or unsubstituted $C_{3-20}$ heterocycloalkyl;
$R^{3a}$ and $R^{3b}$ are each independently hydrogen, substituted or unsubstituted $C_{1-20}$ alkyl, substituted or unsubstituted $C_{3-20}$ cycloalkyl, substituted or unsubstituted $C_{1-20}$ heteroalkyl, substituted or unsubstituted $C_{3-20}$ heterocycloalkyl, substituted or unsubstituted $C_{6-20}$ aryl, or substituted or unsubstituted $C_{3-20}$ heteroaryl; wherein the substituted $C_{1-20}$ alkyl is substituted with nitro, cyano, hydroxyl, carboxylic acid or an alkali metal or ammonium salt thereof, halogen, thiol, $C_{1-6}$ alkylthio, $C_{1-6}$ alkyl, $C_{2-6}$ alkenyl, $C_{2-6}$ alkynyl, $C_{1-6}$ haloalkyl, $C_{1-9}$ alkoxy, $C_{1-6}$ haloalkoxy, $C_{3-12}$ cycloalkyl, $C_{5-18}$ cycloalkenyl, $C_{2-18}$ heterocycloalkenyl, $C_{6-12}$ aryl, $C_{7-19}$ arylalkyl, $C_{7-12}$ alkylaryl, $C_{3-12}$ heterocycloalkyl, $C_{3-12}$ heteroaryl, or a combination thereof; and wherein the $C_{1-20}$ heteroalkyl and the $C_{3-12}$ heterocycloalkyl each independently has a heteroatom selected from O, S, Si, P, or a combination thereof;
each $R^4$ is independently substituted or unsubstituted $C_{1-20}$ alkyl, substituted or unsubstituted $C_{1-20}$ heteroalkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl;

each R[4] optionally further comprises as part of their structure one or more groups selected from —O—, —C(O)—, —S—, —S(O)$_2$—, and —N(R$^{2a}$)—, wherein R$^{2a}$ is hydrogen, substituted or unsubstituted C$_{1-20}$ alkyl, substituted or unsubstituted C$_{3-20}$ cycloalkyl, or substituted or unsubstituted C$_{3-20}$ heterocycloalkyl;

R[1] and R[2] together optionally form a ring via a single bond or a divalent linking group;

any two of R$^{3a}$, R$^{3b}$, or R[4] together optionally form a ring via a single bond or a divalent linking group;

when n is 2 or greater, any two R[4] groups together optionally form a ring via a single bond or a divalent linking group;

m is an integer from 1 to 5; and n is an integer from 0 to 2m.

2. The photoresist composition of claim 1, wherein the additive has a boiling point of greater than or equal to 200° C.

3. The photoresist composition of claim 1, wherein the polymer comprises an acid-labile repeating unit derived from a monomer represented by one or more of Formulae (2), (3), (4), (5), or (6):

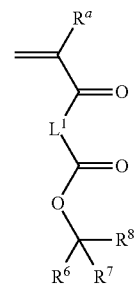

(2)

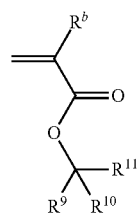

(3)

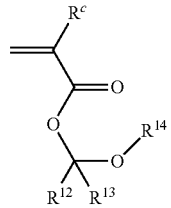

(4)

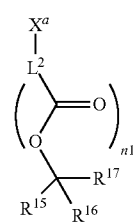

(5)

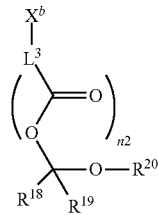

(6)

wherein, in Formulae (2) to (6),

R$^a$ to R$^c$ are each independently hydrogen, fluorine, cyano, or substituted or unsubstituted C$_{1-10}$ alkyl;

L[1] is a divalent linking group;

R[6] to R[11] are each independently hydrogen, substituted or unsubstituted C$_{1-20}$ alkyl, substituted or unsubstituted C$_{3-20}$ cycloalkyl, substituted or unsubstituted C$_{3-20}$ heterocycloalkyl, substituted or unsubstituted C$_{2-20}$ alkenyl, substituted or unsubstituted C$_{3-20}$ cycloalkenyl, substituted or unsubstituted C$_{3-20}$ heterocycloalkenyl, substituted or unsubstituted C$_{6-20}$ aryl, or substituted or unsubstituted C$_{3-20}$ heteroaryl, wherein each of R[6] to R[11] optionally further comprises a divalent linking group as part of their structure;

provided that no more than one of R[6] to R[8] is hydrogen, and provided that when one of R[6] to R[8] is hydrogen, at least one of the others from R[6] to R[8] is substituted or unsubstituted C$_{6-20}$ aryl or substituted or unsubstituted C$_{3-20}$ heteroaryl; and provided that no more than one of R[9] to R[11] is hydrogen, and provided that when one of R[9] to R[11] is hydrogen, at least one of the others from R[9] to R[11] is substituted or unsubstituted C$_{6-20}$ aryl or substituted or unsubstituted C$_{3-20}$ heteroaryl;

any two of R[6] to R[8] together optionally form a ring, wherein the ring optionally further comprises a divalent linking group as part of its structure, and wherein the ring is substituted or unsubstituted;

any two of R[9] to R[11] together optionally form a ring, wherein the ring optionally further comprises a divalent linking group as part of its structure, and wherein the ring is substituted or unsubstituted;

R[12], R[13], R[18], and R[19] are each independently hydrogen, substituted or unsubstituted C$_{1-20}$ alkyl, substituted or unsubstituted C$_{3-20}$ cycloalkyl, substituted or unsubstituted C$_{3-20}$ heterocycloalkyl, substituted or unsubstituted C$_{6-20}$ aryl, or substituted or unsubstituted C$_{3-20}$ heteroaryl, wherein each of R[12], R[13], R[18], and R[19] optionally further comprises a divalent linking group as part of their structure;

R[14] is substituted or unsubstituted C$_{1-20}$ alkyl, substituted or unsubstituted C$_{3-20}$ cycloalkyl, or substituted or unsubstituted C$_{3-20}$ heterocycloalkyl, wherein R[14] optionally further comprises a divalent linking group as part of its structure;

any two of R[12] to R[14] together optionally form a ring, wherein the ring optionally further comprises a divalent linking group as part of its structure, and wherein the ring is substituted or unsubstituted;

R[15] to R[17] are each independently substituted or unsubstituted C$_{1-20}$ alkyl, substituted or unsubstituted C$_{3-20}$ cycloalkyl, substituted or unsubstituted C$_{3-20}$ heterocycloalkyl, substituted or unsubstituted C$_{6-20}$ aryl, or substituted or unsubstituted C$_{3-20}$ heteroaryl, wherein each of R[15] to R[1] optionally further comprises a divalent linking group as part of their structure;

provided that no more than one of $R^{15}$ to $R^{17}$ is hydrogen, and provided that when one of $R^{15}$ to $R^{17}$ is hydrogen, at least one of the others from $R^{15}$ to $R^{17}$ is substituted or unsubstituted $C_{6-20}$ aryl or substituted or unsubstituted $C_{3-20}$ heteroaryl;

any two of $R^{15}$ to $R^{17}$ together optionally form a ring, wherein the ring optionally further comprises a divalent linking group as part of its structure, and wherein the ring is substituted or unsubstituted, $R^{20}$ is substituted or unsubstituted $C_{1-20}$ alkyl, substituted or unsubstituted $C_{3-20}$ cycloalkyl, or substituted or unsubstituted $C_{3-20}$ heterocycloalkyl, wherein $R^{20}$ optionally further comprises a divalent linking group as part of its structure;

any two of $R^{18}$ to $R^{20}$ together optionally form a ring, wherein the ring optionally further comprises a divalent linking group as part of its structure, and wherein the ring is substituted or unsubstituted;

$X^a$ and $X^b$ are each independently a polymerizable group selected from norbornyl or vinyl;

n1 and n2 are each independently 0 or 1; and $L^2$ and $L^3$ are each independently a single bond or a divalent linking group, provided that $L^2$ is not a single bond when $X^a$ is vinyl, and provided that $L^3$ is not a single bond when $X^b$ is vinyl.

4. The photoresist composition of claim 1, wherein the polymer comprises a repeating unit derived from one or more monomers of Formulae (7) or (8)

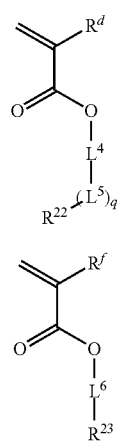

wherein, $R^d$ and $R^f$ are each independently hydrogen, fluorine, cyano, or substituted or unsubstituted $C_{1-10}$ alkyl;

$L^4$ and $L^6$ are each independently a single bond or a divalent linking group;

$L^5$ is a divalent linking group;

q is 0 or 1;

$R^{22}$ is a substituted or unsubstituted organic group comprising one or more heteroatoms; and $R^{23}$ is a substituted or unsubstituted $C_{4-20}$ lactone-containing group or a substituted or unsubstituted $C_{4-20}$ sultone-containing group.

5. The photoresist composition of claim 1, wherein
the polymer comprises a repeating unit comprising a photoacid generator,
the photoacid generator is a non-polymeric compound, or
the polymer comprises a repeating unit comprising a first photoacid generator and a second photoacid generator that is a non-polymeric compound.

6. The photoresist composition of claim 1, further comprising a photo-decomposable quencher or a basic quencher.

7. A method for forming a pattern, the method comprising:

applying a layer of a photoresist composition of claim 1 on a substrate to provide a photoresist composition layer;

pattern-wise exposing the photoresist composition layer to activating radiation to provide an exposed photoresist composition layer; and developing the exposed photoresist composition layer to provide the pattern.

8. The method of claim 7, wherein the activating radiation has a wavelength of 248 nm.

9. The method of claim 7, wherein the photoresist composition layer has a thickness of greater than 5 micrometers.

10. The method of claim 7, wherein the additive has a boiling point of greater than or equal to 200° C.

11. The method of claim 7, wherein the polymer comprises an acid-labile repeating unit derived from a monomer represented by one or more of Formulae (2), (3), (4), (5), or (6):

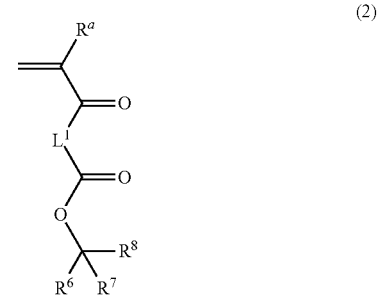

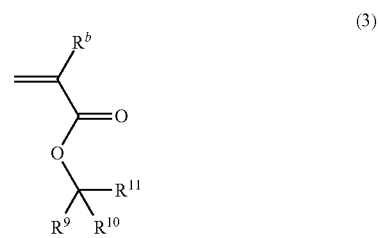

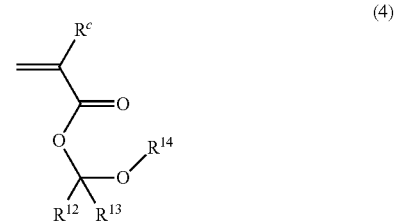

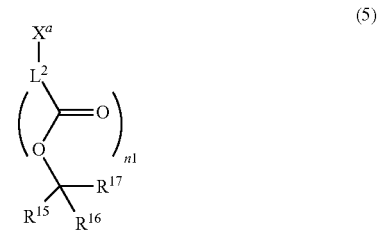

-continued

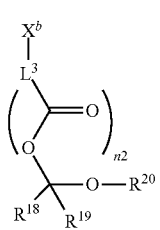

(6)

wherein, in Formulae (2) to (6), $R^a$ to $R^c$ are each independently hydrogen, fluorine, cyano, or substituted or unsubstituted $C_{1-10}$ alkyl;

$L^1$ is a divalent linking group;

$R^6$ to $R^{11}$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{2-20}$ alkenyl, substituted or unsubstituted $C_{3-20}$ cycloalkenyl, substituted or unsubstituted $C_{3-20}$ heterocycloalkenyl, substituted or unsubstituted $C_{6-20}$ aryl, or substituted or unsubstituted $C_{3-20}$ heteroaryl, wherein each of $R^6$ to $R^{11}$ optionally further comprises a divalent linking group as part of their structure;

provided that no more than one of $R^6$ to $R^8$ is hydrogen, and provided that when one of $R^6$ to $R^8$ is hydrogen, at least one of the others from $R^6$ to $R^8$ is substituted or unsubstituted $C_{6-20}$ aryl or substituted or unsubstituted $C_{3-20}$ heteroaryl; and provided that no more than one of $R^9$ to $R^{11}$ is hydrogen, and provided that when one of $R^9$ to $R^{11}$ is hydrogen, at least one of the others from $R^9$ to $R^{11}$ is substituted or unsubstituted $C_{6-20}$ aryl or substituted or unsubstituted $C_{3-20}$ heteroaryl;

any two of $R^6$ to $R^8$ together optionally form a ring, wherein the ring optionally further comprises a divalent linking group as part of its structure, and wherein the ring is substituted or unsubstituted;

any two of $R^9$ to $R^{11}$ together optionally form a ring, wherein the ring optionally further comprises a divalent linking group as part of its structure, and wherein the ring is substituted or unsubstituted;

$R^{12}$, $R^{13}$, $R^{18}$, and $R^{19}$ are each independently hydrogen, substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl, wherein each of $R^{12}$, $R^{13}$, $R^{18}$, and $R^{19}$ optionally further comprises a divalent linking group as part of their structure;

$R^{14}$ is substituted or unsubstituted $C_{1-20}$ alkyl, substituted or unsubstituted $C_{3-20}$ cycloalkyl, or substituted or unsubstituted $C_{3-20}$ heterocycloalkyl, wherein $R^{14}$ optionally further comprises a divalent linking group as part of its structure;

any two of $R^{12}$ to $R^{14}$ together optionally form a ring, wherein the ring optionally further comprises a divalent linking group as part of its structure, and wherein the ring is substituted or unsubstituted;

$R^{15}$ to $R^{17}$ are each independently substituted or unsubstituted $C_{1-20}$ alkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl, wherein each of $R^{15}$ to $R^{17}$ optionally further comprises a divalent linking group as part of their structure;

provided that no more than one of $R^{15}$ to $R^{17}$ is hydrogen, and provided that when one of $R^{15}$ to $R^{17}$ is hydrogen, at least one of the others from $R^{15}$ to $R^{17}$ is substituted or unsubstituted $C_{6-20}$ aryl or substituted or unsubstituted $C_{3-20}$ heteroaryl;

any two of $R^{15}$ to $R^{17}$ together optionally form a ring, wherein the ring optionally further comprises a divalent linking group as part of its structure, and wherein the ring is substituted or unsubstituted, $R^{20}$ is substituted or unsubstituted $C_{1-20}$ alkyl, substituted or unsubstituted $C_{3-20}$ cycloalkyl, or substituted or unsubstituted $C_{3-20}$ heterocycloalkyl, wherein $R^{20}$ optionally further comprises a divalent linking group as part of its structure;

any two of $R^{18}$ to $R^{20}$ together optionally form a ring, wherein the ring optionally further comprises a divalent linking group as part of its structure, and wherein the ring is substituted or unsubstituted;

$X^a$ and $X^b$ are each independently a polymerizable group selected from norbornyl or vinyl;

n1 and n2 are each independently 0 or 1; and $L^2$ and $L^3$ are each independently a single bond or a divalent linking group, provided that $L^2$ is not a single bond when $X^a$ is vinyl, and provided that $L^3$ is not a single bond when $X^b$ is vinyl.

12. The method of claim 7, wherein the polymer comprises a repeating unit derived from one or more monomers of Formulae (7) or (8)

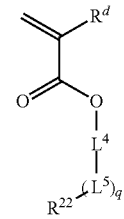

(7)

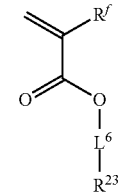

(8)

wherein, $R^d$ and $R^f$ are each independently hydrogen, fluorine, cyano, or substituted or unsubstituted $C_{1-10}$ alkyl;

$L^4$ and $L^6$ are each independently a single bond or a divalent linking group;

$L^5$ is a divalent linking group;

q is 0 or 1;

$R^{22}$ is a substituted or unsubstituted organic group comprising one or more heteroatoms; and $R^{23}$ is a substituted or unsubstituted $C_{4-20}$ lactone-containing group or a substituted or unsubstituted $C_{4-20}$ sultone-containing group.

13. The method of claim 7, wherein the polymer comprises a repeating unit comprising a photoacid generator, the photoacid generator is a non-polymeric compound, or the polymer comprises a repeating unit comprising a first photoacid generator and a second photoacid generator that is a non-polymeric compound.

14. The method of claim 7, further comprising a photodecomposable quencher or a basic quencher.

15. The photoresist composition of claim 1, wherein the additive is selected from one or more of:

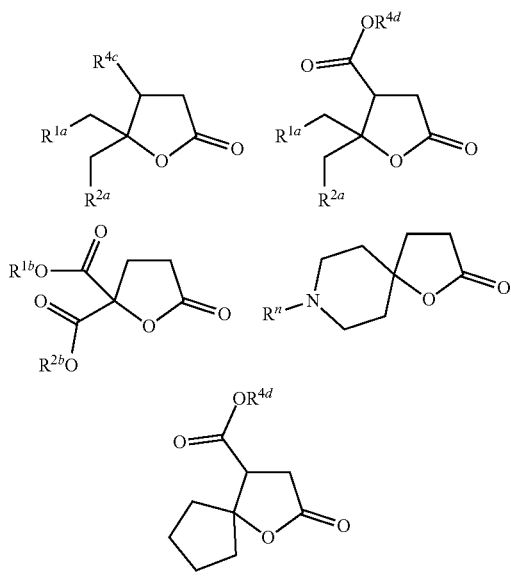

wherein, $R^{1a}$ and $R^{2b}$ are each independently hydrogen, substituted or unsubstituted $C_{1-3}$ alkyl, substituted or unsubstituted $C_{1-20}$ heteroalkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl; and $R^{1b}$, $R^{2b}$, $R^{4c}$, $R^{4d}$, and $R^n$ are each independently hydrogen, substituted or unsubstituted $C_{1-20}$ alkyl, substituted or unsubstituted $C_{1-20}$ heteroalkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl.

16. The method of claim 7, wherein the additive is selected from one or more of:

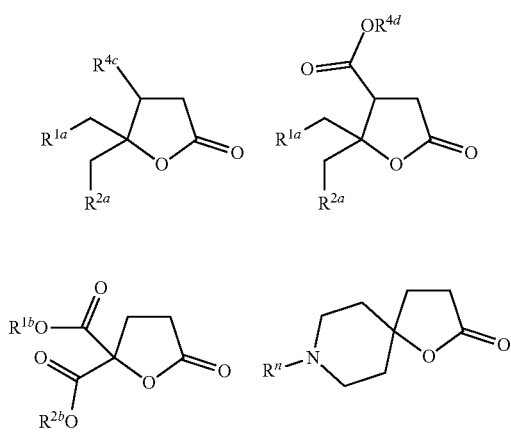

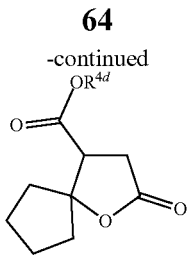

-continued

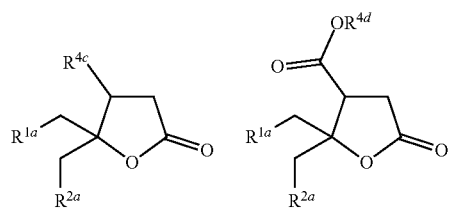

wherein, $R^{1a}$ and $R^{2a}$ are each independently hydrogen, substituted or unsubstituted $C_{1-3}$ alkyl, substituted or unsubstituted $C_{1-20}$ heteroalkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl; and $R^{1b}$, $R^{2b}$, $R^{4c}$, $R^{4d}$, and $R^n$ are each independently hydrogen, substituted or unsubstituted $C_{1-20}$ alkyl, substituted or unsubstituted $C_{1-20}$ heteroalkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl.

17. The photoresist composition of claim 1, wherein the additive is selected from one or more of:

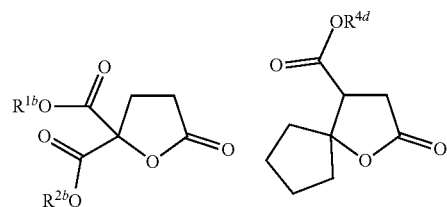

wherein, $R^{1a}$ and $R^{2b}$ are each independently hydrogen, substituted or unsubstituted $C_{1-3}$ alkyl, substituted or unsubstituted $C_{1-20}$ heteroalkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl; and $R^{1b}$, $R^{2b}$, $R^{4c}$, and $R^{4d}$ are each independently hydrogen, substituted or unsubstituted $C_{1-20}$ alkyl, substituted or unsubstituted $C_{1-20}$ heteroalkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl.

18. The method of claim 7, wherein the additive is selected from one or more of:

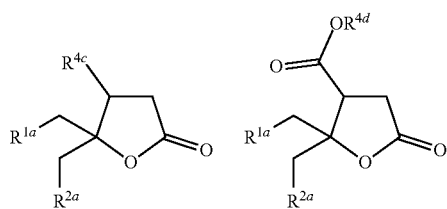

-continued

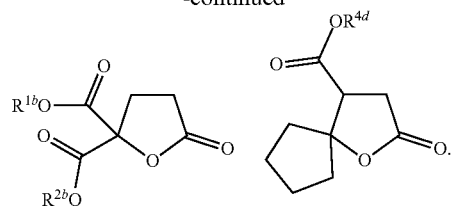

wherein,
$R^{1a}$ and $R^{2a}$ are each independently hydrogen, substituted or unsubstituted $C_{1-3}$ alkyl, substituted or unsubstituted $C_{1-20}$ heteroalkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl; and $R^{1b}$, $R^{2b}$, $R^{4c}$, and $R^{4d}$ are each independently hydrogen, substituted or unsubstituted $C_{1-20}$ alkyl, substituted or unsubstituted $C_{1-20}$ heteroalkyl, substituted or unsubstituted $C_{3-20}$ cycloalkyl, substituted or unsubstituted $C_{3-20}$ heterocycloalkyl, substituted or unsubstituted $C_{6-20}$ aryl, or substituted or unsubstituted $C_{3-20}$ heteroaryl.

* * * * *